(12) United States Patent
Shindo

(10) Patent No.: US 11,326,270 B2
(45) Date of Patent: May 10, 2022

(54) SINGLE-CRYSTAL PRODUCTION EQUIPMENT AND SINGLE-CRYSTAL PRODUCTION METHOD

(71) Applicant: Crystal Systems Corporation, Hokuto (JP)

(72) Inventor: Isamu Shindo, Hokuto (JP)

(73) Assignee: Crystal Systems Corporation, Hokuto (JP)

( * ) Notice: Subject to any disclaimer, the term of this patent is extended or adjusted under 35 U.S.C. 154(b) by 194 days.

(21) Appl. No.: 16/303,297

(22) PCT Filed: Mar. 29, 2018

(86) PCT No.: PCT/JP2018/013163
§ 371 (c)(1),
(2) Date: Nov. 20, 2018

(87) PCT Pub. No.: WO2019/186871
PCT Pub. Date: Oct. 3, 2019

(65) Prior Publication Data
US 2019/0301050 A1 Oct. 3, 2019

(51) Int. Cl.
*C30B 13/08* (2006.01)
*C30B 13/28* (2006.01)
(Continued)

(52) U.S. Cl.
CPC .............. *C30B 13/08* (2013.01); *C30B 13/14* (2013.01); *C30B 13/24* (2013.01); *C30B 13/28* (2013.01)

(58) Field of Classification Search
CPC ....... C30B 11/003; C30B 11/08; C30B 13/08; C30B 13/14; C30B 13/24; C30B 13/28
See application file for complete search history.

(56) References Cited

U.S. PATENT DOCUMENTS

| 4,379,021 A | 4/1983 | Damen et al. |
| 5,108,720 A | 4/1992 | Bourbina et al. |

(Continued)

FOREIGN PATENT DOCUMENTS

| CN | 1272145 A | 11/2000 |
| CN | 1584131 A | 2/2005 |

(Continued)

OTHER PUBLICATIONS

Dym, "Practical handbook of Injection Mold and Injection Molding", 1987, p. 265, Chmical Industry Press, Hong Guobao School, English-language Translation by Shen Jintang.

(Continued)

*Primary Examiner* — Hua Qi
(74) *Attorney, Agent, or Firm* — The Webb Law Firm

(57) ABSTRACT

A single-crystal production equipment which includes, at least: a raw material supply apparatus which supplies a granular raw material to a melting apparatus positioned therebelow; the melting apparatus heats and melts the granular raw material to generate a raw material melt and supplies the raw material melt into a single-crystal production crucible positioned therebelow; and a crystallization apparatus which includes the single-crystal production crucible in which a seed single crystal is placed on the bottom, and a first infrared ray irradiation equipment which irradiates an infrared ray to the upper surface of the seed single crystal in the single-crystal production crucible, and the single-crystal production equipment is configured such that the raw material melt is dropped into a melt formed by irradiating the upper surface of the seed single crystal with the infrared ray, and a single crystal is allowed to precipitate out of the thus formed mixed melt.

18 Claims, 6 Drawing Sheets

(51) Int. Cl.
*C30B 13/14* (2006.01)
*C30B 13/24* (2006.01)

(56) References Cited

U.S. PATENT DOCUMENTS

| | | | |
|---|---|---|---|
| 5,116,456 A | | 5/1992 | Nestor |
| 5,178,719 A | | 1/1993 | Pandelisev |
| 5,211,802 A | | 5/1993 | Kaneko et al. |
| 5,360,480 A | * | 11/1994 | Altekruger ............. C30B 15/02 117/208 |
| 5,367,981 A | | 11/1994 | Maruyama |
| 5,454,424 A | | 10/1995 | Mori et al. |
| 5,462,010 A | * | 10/1995 | Takano ................ B01J 8/002 117/14 |
| 5,492,079 A | | 2/1996 | Geissler et al. |
| 5,762,707 A | | 6/1998 | Shindo |
| 5,902,395 A | | 5/1999 | Nagai et al. |
| 5,916,364 A | | 6/1999 | Izumi |
| 5,919,306 A | | 7/1999 | Takemura |
| 5,961,715 A | * | 10/1999 | Ikeda .................. C30B 15/14 117/13 |
| 6,027,563 A | * | 2/2000 | Choudhury ........... C30B 11/003 117/18 |
| 6,325,849 B1 | | 12/2001 | Hideo et al. |
| 6,361,597 B1 | * | 3/2002 | Takase ................ C30B 15/02 117/18 |
| 6,387,178 B1 | | 5/2002 | Geho et al. |
| 6,402,834 B1 | | 6/2002 | Nagai et al. |
| 2003/0150374 A1 | | 8/2003 | Sasatani et al. |
| 2007/0051296 A1 | | 3/2007 | Kemmochi et al. |
| 2007/0051297 A1 | | 3/2007 | Kemmochi et al. |
| 2007/0056504 A1 | | 3/2007 | Lim |
| 2007/0169684 A1 | * | 7/2007 | Stoddard ............. C30B 11/003 117/13 |
| 2009/0047203 A1 | | 2/2009 | Mueller |
| 2009/0249994 A1 | | 10/2009 | Liu et al. |
| 2009/0321996 A1 | | 12/2009 | Kaneko |
| 2010/0037817 A1 | * | 2/2010 | Shindo ................ C30B 13/24 117/222 |
| 2010/0116196 A1 | * | 5/2010 | Liu ...................... C30B 11/02 117/74 |
| 2010/0307406 A1 | | 12/2010 | Shindo |
| 2011/0174214 A1 | | 7/2011 | Horioka |
| 2011/0259262 A1 | * | 10/2011 | Khattak ............... C30B 29/06 117/81 |
| 2012/0228081 A1 | | 9/2012 | Tadokoro |
| 2013/0008370 A1 | * | 1/2013 | Sakurada ............. C30B 11/00 117/73 |
| 2013/0220215 A1 | | 8/2013 | Eidelman et al. |
| 2013/0233237 A1 | * | 9/2013 | Bender ................ C30B 29/06 117/31 |
| 2014/0158858 A1 | | 6/2014 | Yamao et al. |
| 2015/0176150 A1 | | 6/2015 | Broyer et al. |
| 2016/0024685 A1 | | 1/2016 | Swaminathan |
| 2016/0060787 A1 | | 3/2016 | Park |
| 2016/0230307 A1 | | 8/2016 | Stoddard et al. |
| 2016/0348271 A1 | | 12/2016 | Ravi et al. |
| 2018/0282898 A1 | * | 10/2018 | Hudelson ............. C30B 11/006 |
| 2019/0032242 A1 | | 1/2019 | Shindo |

FOREIGN PATENT DOCUMENTS

| | | |
|---|---|---|
| CN | 101910473 A | 12/2010 |
| CN | 102187018 A | 9/2011 |
| CN | 104328483 A | 2/2015 |
| EP | 0787837 A1 | 8/1997 |
| EP | 1930483 A1 | 8/2005 |
| EP | 2128308 A1 | 12/2009 |
| EP | 3299498 A1 | 5/2017 |
| JP | 59015056 U1 | 1/1984 |
| JP | S61197493 A | 9/1986 |
| JP | H05286791 A | 11/1993 |
| JP | H06100394 A | 4/1994 |
| JP | H6345583 A | 12/1994 |
| JP | H09249494 A | 9/1997 |
| JP | H10273374 A | 10/1998 |
| JP | H11274537 A | 10/1999 |
| JP | H11292682 A | 10/1999 |
| JP | 2004189537 A | 7/2004 |
| JP | 200881398 A | 4/2008 |
| JP | 5279727 | 12/2010 |
| JP | 2014076915 A | 5/2014 |
| JP | 2014114149 A | 6/2014 |
| JP | 2014114149 A * | 6/2014 |
| JP | 2014141360 A | 8/2014 |
| RU | 2418109 C1 | 5/2011 |
| WO | 2009081811 A1 | 7/2009 |
| WO | 2013/141471 A1 | 9/2013 |
| WO | 2018/003386 A1 | 1/2018 |

OTHER PUBLICATIONS

Pu, "Universal library for Primary and Middle School Students Information Technology", 2010, p. 63, Hefei Huangshan Book Company, English-Language Translation.

Zhu, "Application and Modificiation of Polypropylene Plastic", 1982, pp. 338-339, Light Industry Press, English-language Transaltion.

* cited by examiner

[FIG. 1]
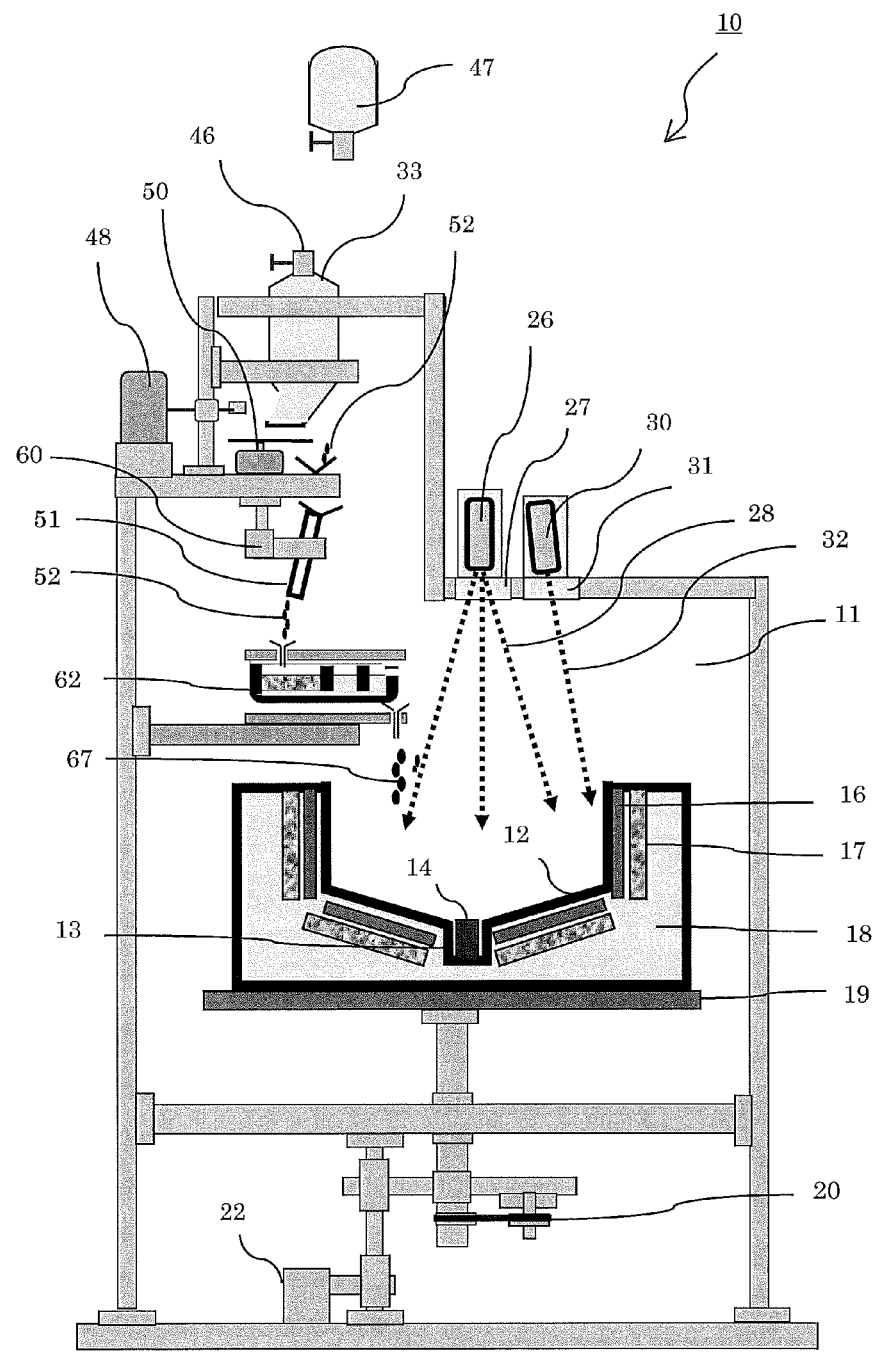

[FIG. 2]
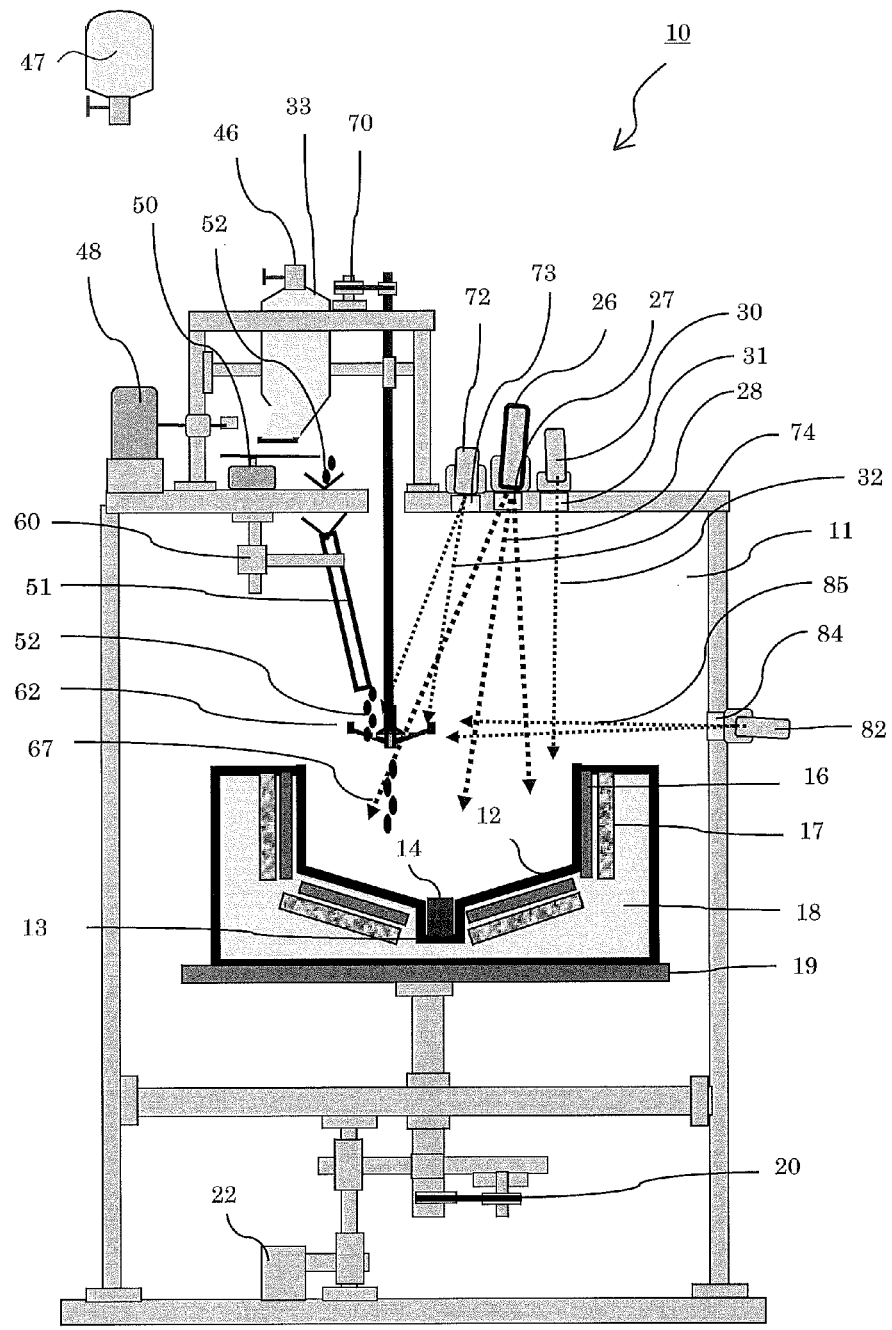

[FIG. 3]
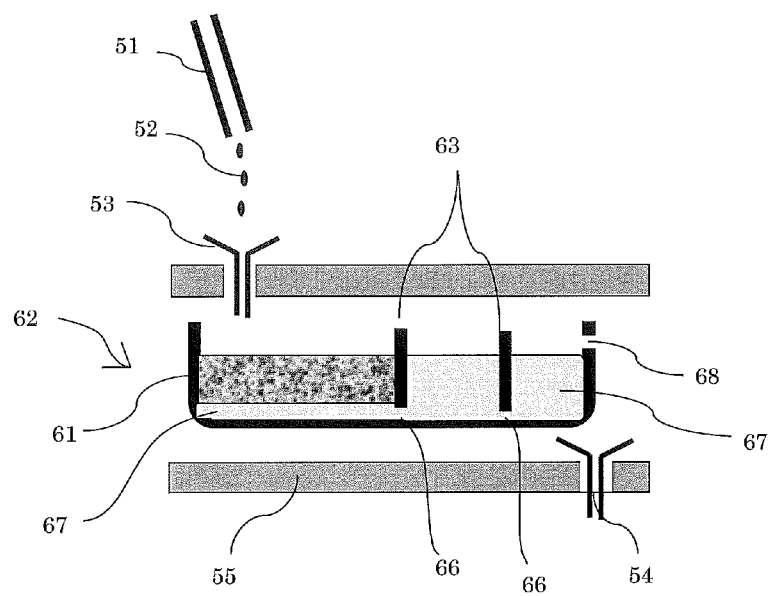

[FIG. 4]
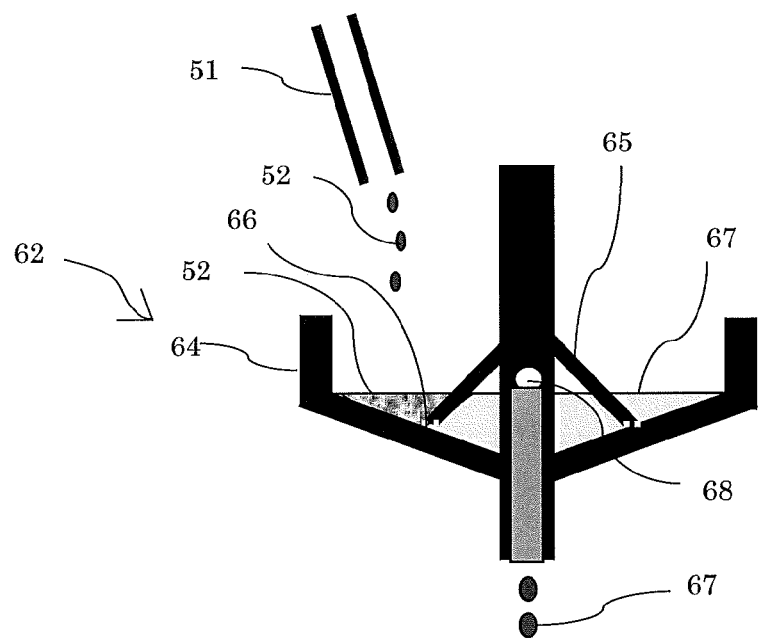

[FIG. 5]
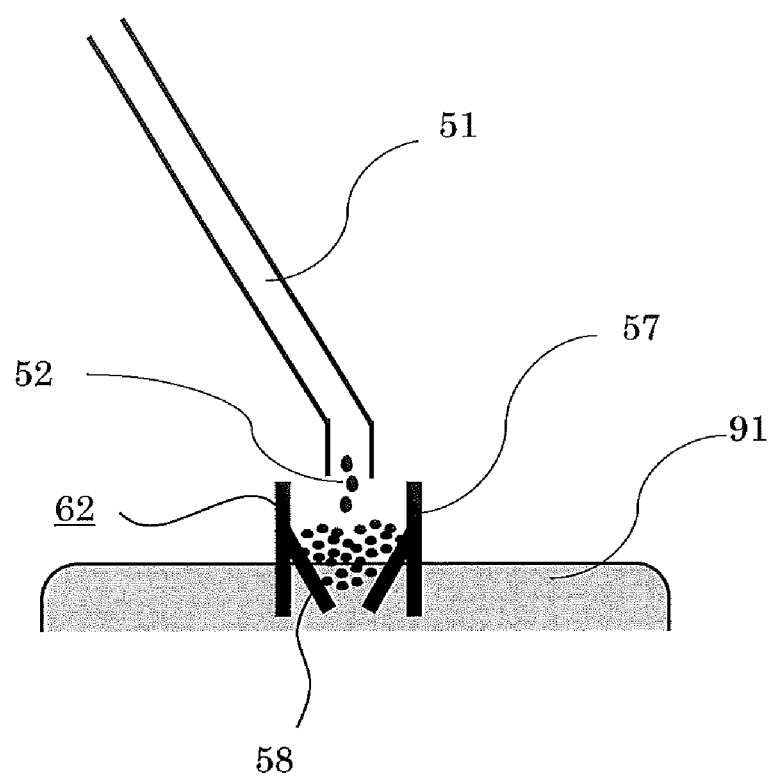

SINGLE-CRYSTAL PRODUCTION EQUIPMENT AND SINGLE-CRYSTAL PRODUCTION METHOD

CROSS-REFERENCE TO RELATED APPLICATION

This application is the United States national phase of International Application No. PCT/JP2018/013163 filed Mar. 29, 2018, the disclosure of which is hereby incorporated in its entirety by reference.

TECHNICAL FIELD

The present invention relates to: a single-crystal production equipment which highly efficiently produces a large single crystal of, for example, 1,000 to 2,000 mm in diameter while homogenizing its composition to be optimum; and a single-crystal production method of producing a large single crystal having an optimum dopant composition (hereinafter, also referred to as "optimum crystal" using the single-crystal production equipment.

BACKGROUND ART

In the so-called solar cell industry where solar energy is utilized to generate power used as electrical energy, a variety of materials have been examined and put into practice as materials that convert sunlight into electrical energy and, among such materials, crystalline silicon accounts for the greater part of the market.

Although the power generation cost using a solar cell have been largely reduced than before, it is still considered rather high as compared to the power generation cost of, for example, a thermal power plant using fossil energy, a hydraulic power plant or a nuclear power plant, and a further cost reduction is demanded.

In solar cells using crystalline silicon, a single-crystal silicon substrate having a single orientation as a whole (hereinafter, also referred to as single-crystal substrate") or a polycrystalline silicon substrate containing a large number of grain boundaries (hereinafter, also referred to as "polycrystal substrate") is used. Since the grain boundaries contained in a polycrystal substrate are believed to deteriorate the solar cell properties, a single-crystal substrate is more convenient for high-efficiency power generation. However, the cost of a conventional single-crystal substrate production method is rather expensive than the production cost of a polycrystal substrate; therefore, it has been desired to develop a novel production method by which a high-performance single-crystal substrate can be produced inexpensively.

For the utilization of a single-crystal substrate in a solar cell, the single-crystal substrate may be of boron-doped P-type or phosphorus-doped N-type; however, there are growing expectations for phosphorus-doped N-type single-crystal substrates since they make high-efficient power generation possible.

Specifically, a system called "HIT type", in which amorphous silicon that can be used in a relatively short wavelength region and a phosphorus-doped N-type single-crystal substrate that can be used in a relatively long wavelength region are used in combination, is regarded as a system capable of achieving high conversion efficiency.

Further, also in a system where electrodes conventionally arranged on both sides of a substrate are arranged only on the back side and highly efficient utilization of sunlight is thereby made possible, an N-type silicon single-crystal substrate is required in the same manner as in the HIT-type system.

As a method of producing crystalline silicon used in a solar cell, a method belonging to so-called "melt method", in which a melt formed by melting a raw material is solidified to produce a single crystal, can most quickly produce a large crystal. As methods belonging to such a "melt method", for example, a casting method in which a melt is poured into a mold and then solidified, a unidirectional solidification method in which a melt in a crucible is solidified from a lower part to an upper part, a pulling method in which a seed single crystal is immersed into a melt in a crucible and then pulled upward while being allowed to grow, and a floating-zone melting method in which a melt is formed by local heating of a rod-shaped raw material, and melting and solidification of the raw material are continuously performed, are known.

In these melt methods, industrially, a system of using a crucible for retaining a melt to be formed is employed in many cases as being most advantageous for the production of a large single crystal. Meanwhile, the floating-zone melting method, which does not use a crucible and thus has advantages in that it can yield a high-purity product without any contamination from a crucible and that the resulting product has a uniform dopant concentration because of continuous melting and solidification of a raw material, has been mainly used for research and development.

As a crucible material, quartz that can stably retain a melt and is conveniently inexpensive is used since, in the case of producing a silicon single crystal, a silicon melt is highly reactive and no other appropriate material can be found. However, the use of quartz requires careful attention since quartz reacts with a silicon melt to generate silicon monoxide (SiO) that is partially solid-dissolved in the resulting product.

As a method of producing a large single crystal by forming a raw material melt in a crucible, the Bridgman method is known. This is a method in which a seed single crystal is placed on the bottom of a crucible, and a raw material melt thereabove is solidified on the seed single crystal to produce a single crystal as a whole.

However, in the production of a silicon single crystal by this method, there is a problem that a silicon melt and quartz are fused together and solidified to induce crack generation in the resulting product. This problem is mainly caused by the difference in thermal expansion coefficient between silicon and quartz in a cooling process.

Thus, a casting method in which a raw material melt is poured into a carbon mold and then solidified was first put into practice. A carbon material reacts with a silicon melt to generate silicon carbide; however, since the silicon melt starts to solidify immediately after coming into contact with the carbon material, the generation of silicon carbide is restricted only to the mold surface and the generated silicon carbide is peeled off from the underlying carbon, so that crack generation in the resulting product can be inhibited.

Still, since the solidification of the melt starts from allover a carbon crucible, the product is an aggregate of numerous small crystals, which is referred to as "polycrystalline silicon".

Such a polycrystalline silicon aggregate produced by a casting method is cut in the horizontal direction and used as a substrate and, in an upper part and a lower part of the crucible, the boundaries between single-crystal particles exist along the vertical direction of the substrate. Meanwhile, in the vicinity of the center of the crucible, the boundaries between single-crystal particles exist along the parallel direction of the substrate.

It is known that the properties such as electrical conductivity are deteriorated at the boundaries of single-crystal particles; however, when the boundaries exist in the vertical direction with respect to a thin section, those parts other than the boundaries exist as single-crystal particles.

Yet, with the boundaries existing in the direction parallel to the thin section, since hardly any single-crystal particles exist penetrating through the thin section and a strong effect of the boundaries makes it difficult to effectively extract the generated power, the apparent conversion efficiency is deteriorated.

Thus, by arranging an electric furnace on the outer side of each crucible and thereby forming a temperature gradient along the vertical direction, an equipment was refined such that solidification proceeds only in an upward direction from the lower side of the crucible. A production method using such a refined novel equipment is referred to as "unidirectional solidification method" in the discipline of crystal growth.

The unidirectional solidification method made it possible to produce a crystal having an improved efficiency as a solar cell; however, in this method, since the reaction time of a carbon crucible and a silicon melt is incomparably longer, a silicon carbide phase generated by the reaction is far thicker than in a casting method.

Silicon carbide is rigid and thus causes various troubles in the substrate production process such as cutting; therefore, it was difficult to improve the product yield.

Thereafter, a method in which the surface of a crucible made of quartz (hereinafter, also referred to as "quartz crucible") is coated with a silicon nitride material as a release agent to prevent quartz and silicon from fusing together and to thereby inhibit cracking of the resulting solidified product was put into practice.

From the previously employed casting method in which a raw material melt is poured into a carbon crucible and then solidified and the subsequently developed unidirectional solidification method which was devised such that solidification continuously proceeds from a lower part to an upper part in a carbon crucible by forming a temperature gradient along the vertical direction of the carbon crucible, the mainstream has shifted to a unidirectional solidification method in which silicon is melted in a release agent-coated quartz crucible and the resulting melt is subsequently allowed to slowly solidify as is from a lower part to an upper part in the quartz crucible to produce a large crystal. There are people in the industry who habitually call this "unidirectional solidification method" as a "casting method" as before; however, this is a mistake.

In this unidirectional solidification method, since solidification of a melt does not start from one spot but from the entirety of the bottom a crucible, a large number of single-crystal particles start to grow separately. Consequently, as a whole, a polycrystal having a construction of aggregated single-crystal particles is produced.

As a method of crystallizing the whole product as a single crystal by a unidirectional solidification method, the Bridgman method is known as described above. When silicon is used, however, it has been considered difficult to apply the Bridgman method since the use of a release agent for inhibition of fusion between a quartz crucible and a silicon melt causes silicon microcrystals to start growing from the parts coated with the release agent, so that a single crystal is not formed as a whole.

As methods of producing single-crystal silicon, for example, a rotary pulling method (pulling method), a high-frequency floating-zone melting method (high-frequency FZ method) and an infrared floating-zone melting method (infrared FZ method) are known.

In a pulling method, a silicon raw material is melted in a quartz crucible, a thin seed single crystal is immersed therein, and a single crystal is allowed to grow continuously while the single crystal is gradually fattened and pulled up, whereby a large single crystal is obtained.

In the high-frequency FZ method, a round rod-shaped raw material rod and a seed single crystal arranged below the raw material rod are prepared, a lower part of the round rod-shaped raw material rod is heat-melted by high-frequency induction, the resulting melt is joined with the seed single crystal below, and the whole resultant is lowered so as to continuously perform melting of the raw material rod on the upper side of the melt and solidification of a single crystal from the melt on the lower side, whereby a single crystal is produced.

This high-frequency FZ method does not use a quartz crucible and is thus capable of producing a high-purity single crystal having no contamination with a quartz component. However, the maximum diameter of a single crystal that can be produced is small and a specially-prepared highly dense and expensive raw material rod is required; therefore, the high-frequency FZ method is not employed for the production of a silicon single crystal for common solar cells.

In the infrared FZ method, as in the high-frequency FZ method, a round rod-shaped raw material is locally heated by irradiation with an infrared ray to form a melt, and melting of the raw material on the upper side of the melt and precipitation of a solid as a single crystal on the lower side are continuously performed, whereby a single crystal is produced.

The infrared FZ method can be applied to a wide variety of materials of raw material rods ranging from insulators to good conductors; however, since the maximum diameter of a product that can be produced is small, the infrared FZ method is not employed for industrial purposes that require a large single crystal.

For utilization of crystalline silicon as a solar cell, a substrate doped with boron or phosphorus as a dopant is used. An excessively low dopant concentration leads to a reduction in the conversion efficiency, while an excessively high dopant concentration also deteriorates the conversion efficiency due to recombination; therefore, there is an optimum concentration for both boron and phosphorus, and it is needless to say that a product that is uniform and has such an optimum-concentration composition throughout the crystal is desired.

The above-described pulling method belongs to so-called unidirectional solidification method where a melt is entirely solidified from an upper part in the downward direction; therefore, it is known to have a characteristic feature that the concentration of a dopant such as boron and phosphorus in the resulting product is not constant due to a segregation phenomenon.

In other words, a melt and a solidified crystal do not have the same dopant concentration, and solidification proceeds at a ratio defined by the substance. This ratio is referred to as "distribution coefficient" and, taking the concentration in the melt as 1, the concentration in the resulting crystal is approximately 0.8 for boron and approximately 0.35 for phosphorus.

Accordingly, after the start of solidification from the dopant-containing melt, the dopant concentration in the generated crystal is lower than that in the melt, and the difference remains in the melt, so that the dopant concentration in the melt gradually increases as the single crystal grows.

Since the ratio between the dopant concentration in the melt and the dopant concentration in the generated crystal is defined by a distribution coefficient, when the dopant concentration in the melt increases as crystallization proceeds, the dopant concentration in the crystal being generated also gradually increases.

When a phosphorus-doped N-type silicon crystal having a low distribution coefficient of approximately 0.35 is produced by a pulling method, there is an essential problem that the phosphorus concentration largely varies in the crystal and, even if a raw material melted in a crucible is entirely solidified to produce a single crystal, the part having an optimum composition in the product is extremely small.

That is, when a product is manufactured using only a substrate having an optimum composition, although the product has a high conversion efficiency as a solar cell, the production cost is extremely high.

On the other hand, when the cost is reduced by widening the composition range and using a substrate having a much lower concentration than the optimum composition and a substrate having a much higher concentration than the optimum composition, the conversion efficiency as a solar cell is deteriorated.

Generally, as a means for reducing the production cost, it is sometimes devised to reduce the unit product cost by increasing the size of each product and thereby increasing the quantity of products that can be produced by the same process. In the case of silicon for solar cells, since a product having a diagonal length of 220 mm is recently regarded as a standard-size product, it is considered to reduce the unit cost by producing a large single crystal having a diameter of greater than 500 mm, which is equivalent to producing four times the quantity of a standard-size product at once, by a pulling method.

Still, when it is actually tried to produce such a large single crystal having a diameter of greater than 500 mm by a pulling method, an extra-large production equipment is necessary, and this makes the production cost exceedingly high.

The only way to make the dopant concentration uniform at an optimum composition in a so-called melt method where a raw material is initially melted and then solidified is to apply a scheme called "traveling solvent method".

That is, an optimum-composition solid is solidified only from a solution having a composition coexisting at an equilibrium (this solution is referred to as "solvent"); however, since the solidification causes a change in the composition of the solution, it is necessary to maintain the composition and amount of the solvent constant at all times by supplying thereto a raw material having the same composition and amount as the solvent being solidified.

According to this scheme, since the solvent travels from one side of a round rod-shaped raw material and melts the raw material therein simultaneously with precipitation of a solid from the solvent, it appears as if the solvent is traveling. Hence, this scheme is called "traveling solvent method".

As for the composition of the solvent, for example, when silicon is doped with phosphorus, since the distribution coefficient is approximately 0.35, the solvent has a concentration of approximately three times higher than that of a crystal having an optimum-concentration composition.

In the production of a single-crystal silicon by the Bridgman method that is capable of producing a large single crystal in principle, quartz is the only crucible material that can be applied; however, since quartz fuses with silicon to cause cracking in the resulting product, the quartz surface has to be coated with a release agent.

However, it is known that new microcrystals are generated from the release agent-coated parts and a single crystal is thus not formed.

This means that, as long as the generation of microcrystals from the release agent-coated parts can be inhibited or the growth of the generated microcrystals can be suppressed, the resulting product is entirely a large single crystal, excluding those parts in the vicinity of the inner wall of the crucible.

Therefore, the development a method in which a traveling solvent method is applied by controlling the amount of a raw material being supplied to be the same as the amount of a solid being precipitated while maintaining the scheme of large single-crystal production by the Bridgman method where the growth of new microcrystals from the inner wall of a crucible coated with a release agent should make it possible to produce a large single crystal having a uniform dopant concentration with an optimum composition.

The contribution of such a novel production method to the fields where single crystals are utilized, such as the solar cell industry and other various industries of communication, medicine and the like, would be immeasurable.

CITATION LIST

Patent Literature

[Patent Literature 1] JP 2014-076915A

When utilizing a single-crystal material in industrial applications, a dopant is often required. For example, in the utilization of a single-crystal silicon as a solar cell substrate, boron or phosphorus is doped thereto, and there is an optimum concentration for such a dopant. An excessively low dopant concentration leads to a reduction in the power generation efficiency, while an excessively high dopant concentration causes the occurrence of a recombination phenomenon, also resulting in a reduction in the power generation efficiency.

Therefore, a single-crystal material is required to be uniform at an optimum dopant concentration; however, a pulling method, which is a representative method of producing a single-crystal material, has a fatal defect that it cannot produce a single crystal having a uniform dopant concentration.

For the production of a single crystal having a uniform composition by a pulling method, a double-crucible pulling method to which the above-described traveling solvent method can be applied is known. However, when silicon is used, the material that can be used as a crucible material is limited to quartz, and such a method has not been successfully put into practice due to several factors, such as softening of the quartz material around the melting point of silicon and intensified reaction of the quartz material with a silicon melt.

In view of the above-described circumstances, an object of the present invention is to provide: a single-crystal production equipment which is capable of producing a large single crystal that has a uniform dopant concentration with an optimum composition in both the vertical and horizontal directions, while taking advantage of the Bridgman method that can yield a large single crystal; and a single-crystal production method using the single-crystal production equipment.

SUMMARY OF THE INVENTION

In order to produce a uniform single crystal having an optimum concentration by a so-called "melt method" in which a melt generated by melting a raw material is solidified to produce a single crystal, it is indispensable to apply a traveling solvent method.

That is, the present invention provides: a single-crystal production equipment which has functions of solidifying a single crystal from a melt having a composition that can yield a crystal having an optimum concentration and, at the same time, continuously supplying, into the melt, a raw material melt having the optimum concentration in the same composition and amount as the raw material melt being solidified; and a single-crystal production method using the single-crystal production equipment.

As a means for solving the above-described problems, the present inventor invented: a novel single-crystal production equipment which can produce a large single crystal taking advantage of the elemental technologies of the Bridgman method, while allowing the single crystal to uniformly have an optimum composition; and a single-crystal production method using the single-crystal production equipment.

In the production of a silicon single crystal by the Bridgman method that is conventionally known as a method capable of yielding a large single crystal, since quartz used as a crucible material and a silicon melt are fused together and solidified, their difference in thermal expansion coefficient causes a problem of crack generation in the resulting product.

Such crack generation can be inhibited by coating the inner wall of a quartz crucible with a release agent; however, this has a problem in that, due to the growth of numerous microcrystals from the release agent-coated parts, a polycrystal is formed as a whole, and the desired single crystal thus cannot be obtained.

Quartz is an inexpensive crucible material that can hold a silicon melt; however, the use of a quartz crucible requires coating thereof with a release agent and, since the coating with a release agent causes the growth of microcrystals from the coated part, a single-crystal production method using a release agent-coated quartz crucible has not been known.

The present inventor discovered a method of producing a large single crystal using a large crucible by solidifying a melt formed on the upper surface of a seed single crystal arranged in a lower part of the large crucible, wherein the entirety of the melt is solidified while increasing the temperature of the periphery of the melt to inhibit the growth of microcrystals and to thereby make the majority of the melt excluding its periphery into a single crystal.

Further, in order to produce a single crystal having a uniform composition by a melt method, it is essential to apply a "traveling solvent method". In the production of a single crystal with application of this "traveling solvent method", it is desired that the thickness of a melt phase serving as a solvent be as small as possible and uniform.

That is, a solid having optimum composition and dopant concentration coexists at an equilibrium with a melt having a dopant concentration defined by a distribution coefficient. In order to produce a uniform single crystal having an optimum composition while maintaining this condition, it is required to supply a raw material melt having the optimum composition in the same amount simultaneously with the precipitation of the solid from the melt as a single crystal and to thereby maintain the composition and the amount of the melt phase to be constant at all times.

In this case, when the melt phase has a small thickness, it is easy to make the concentration of the entire melt phase uniform; however, when the melt phase is thick, it takes time to make the concentration uniform. Accordingly, in order to make the melt phase uniform, it is necessary to slow down the solid precipitation rate, i.e., the single crystal production rate.

Moreover, in a later stage of the single-crystal production, although the production of a single crystal having a uniform composition is terminated when dropwise addition of the raw material melt is terminated, the remaining melt phase continues to be solidified and the entirety thereof is eventually solidified. However, a region of the thus solidified melt phase has a varying composition and is thus not included in a product in a strict sense. Accordingly, the smaller the size of this portion not included in a product, the more convenient it is.

In other words, the thinner the melt phase, the more convenient it is. However, a single-crystal production equipment or a single-crystal production method that can form a thin melt phase in a lower part of a crucible has not been known.

When a material has a high absorption capacity, the temperature of the material can be easily increased to forma melt by irradiating the material with an infrared ray. In this case, the infrared ray is absorbed by the material and thus does not reach a deep part of the resulting melt phase.

For example, when the material is silicon, the resulting melt phase has a thickness of approximately 20 to 30 mm at most. This means that, in the production of a single crystal having a uniform composition through the formation of a melt phase by irradiation with an infrared ray and application of a traveling solvent method, since the thickness of the resulting melt phase stays to be approximately 20 to 30 mm at most, fluctuations in the melt phase composition associated with the single-crystal production can be easily made uniform and a solidified part of the melt phase that is generated in a later stage of the single-crystal production can be made small, so that the good-product yield can be conveniently improved.

The present inventor invented: a novel large single-crystal production equipment in which, as described above, the elemental technologies of the Bridgman method that make the production of a large single crystal possible are incorporated and a solvent traveling method can be efficiently applied by adopting a system of irradiating an infrared ray; and a single-crystal production method by which a large single crystal having a uniform composition can be produced.

That is, the single-crystal production equipment of the present invention is a single-crystal production equipment for producing a large single crystal by placing a seed single crystal in a single-crystal production crucible, supplying a raw material melt, which is obtained by melting a granular raw material using a granular raw material melting apparatus, into the single-crystal production crucible, and allowing a single crystal to precipitate as a solid on the seed single crystal, wherein the single-crystal production equipment includes, at least:

a granular raw material supply apparatus which supplies a certain amount of the granular raw material to a granular raw material melting apparatus positioned therebelow;

the granular raw material melting apparatus which heats and melts the granular raw material supplied from the granular raw material supply apparatus to generate a raw material melt and supplies the raw material melt into the single-crystal production crucible positioned therebelow; and a crystallization apparatus which includes the single-crystal production crucible in which the seed single crystal is placed on the bottom, and a first infrared ray irradiation equipment which irradiates an infrared ray to the upper surface of the seed single crystal in the single-crystal production crucible, and the single-crystal production equipment is configured such that the raw material melt supplied from the granular raw material melting apparatus is dropped into a melt formed by irradiating the upper surface of the seed single crystal with the infrared ray, and a single crystal is allowed to precipitate out of the thus formed mixed melt.

By this configuration, the granular raw material having an optimum composition (granular crystal base material+ granular dopant) is continuously supplied to the granular raw material melting apparatus, and the raw material melt generated by melting the granular raw material is continuously dropped into the single-crystal production crucible (hereinafter, also simply referred to as "crucible").

In addition, by controlling the irradiation dose and the irradiation distribution of the infrared ray such that the thickness of a melt phase formed on the upper surface of the seed single crystal by irradiation with the infrared ray from the first infrared ray irradiation equipment is maintained constant, the resulting single crystal is allowed to have the same composition as that of the dropped raw material melt having an optimum composition, so that a single crystal having a uniform composition in both the vertical and horizontal directions at an optimum concentration can be produced.

The first infrared ray irradiation equipment of the crystallization apparatus is preferably arranged above the crucible.

The thickness of the melt phase obtained by irradiating the upper surface of the seed single crystal in the crucible using the first infrared ray irradiation equipment is desirably as small as possible.

In a later stage of the single-crystal production, the melt phase is solidified to finish the production and, when the melt phase is solidified as is without dropping thereto the raw material melt, the dopant concentration of the solidified region increases as the progress of the solidification, making the resultant product substandard. When the melt phase has a large thickness, such a substandard region is increased. Accordingly, the melt phase is desired to have small thickness since the overall recovery rate of a high-quality product can be thereby improved.

The single-crystal production equipment of the present invention is characterized in that the granular raw material supply apparatus includes:

a hopper which stores the granular raw material; and a granular raw material quantitative supply equipment which controls the granular raw material in the hopper to be supplied at a prescribed rate and supplies a certain amount of the granular raw material downward.

The single-crystal production equipment of the present invention is also characterized in that the granular raw material supply apparatus includes a granular raw material scraping equipment which scrapes the granular raw material out of the hopper and supplies the granular raw material downward.

Further, the single-crystal production equipment of the present invention is characterized in that the granular raw material supply apparatus includes a supply pipe through which the granular raw material supplied from the granular raw material quantitative supply equipment is supplied to a prescribed position of the granular raw material melting apparatus below.

Still further, the single-crystal production equipment of the present invention is characterized in that a material of the supply pipe is quartz.

Yet still further, the single-crystal production equipment of the present invention is characterized in that:

an opening is formed on a lower part of the hopper; and a rotatable spiral rod is arranged inside the hopper.

When the granular raw material is scraped out of the hopper storing the granular raw material, a phenomenon in which a cavity is created in the granular raw material inside the hopper and the granular raw material can thus no longer be taken out of the hopper may occur.

By arranging a spiral rod inside the hopper and rotating this rod in such a manner that the above-described phenomenon is inhibited and the granular raw material can be scraped out stably and continuously, the cavity generation can be inhibited.

Moreover, in order to scrape the granular raw material out of the hopper in a stable manner, for example, a granular raw material scraping equipment in which a receptacle having a spoon-like shape is attached to a tip of a rod is inserted into the opening formed on a lower part of the hopper and subsequently pulled out and then half-rotated to scrape out and drop below the granular raw material collected on the granular raw material scraping equipment, whereby the granular raw material can be taken out of the hopper continuously and stably.

The weight of the granular raw material supplied from the granular raw material scraping equipment is measured, and the granular raw material quantitative supply equipment accurately controls the granular raw material to be supplied at a prescribed rate and supplies the granular raw material through the supply pipe to a prescribed position of the granular raw material melting apparatus below. The material of the supply pipe is not particularly restricted; however, it is desirably quartz when silicon is used. Quartz is unlikely to be contaminated with metal impurities.

Yet still further, the single-crystal production equipment of the present invention is characterized in that the hopper includes an attachment-detachment mechanism for attaching and detaching a storage container storing the granular raw material.

Yet still further, the single-crystal production equipment of the present invention is characterized in that the attachment-detachment mechanism has an atmosphere controlling function of arbitrarily controlling the atmosphere inside the attachment-detachment mechanism and the storage container.

Yet still further, the single-crystal production equipment of the present invention is characterized in that the granular raw material melting apparatus and the crystallization apparatus are arranged inside a closed chamber.

Yet still further, the single-crystal production equipment of the present invention is characterized in that the granular raw material supply apparatus is also arranged inside the closed chamber.

Yet still further, the single-crystal production equipment of the present invention is characterized by including an atmosphere control equipment which connects the inside of the hopper with the closed chamber, or controls the inside of the hopper and the closed chamber to have the same atmosphere.

In this manner, by connecting the storage container storing the granular raw material to the hopper, arbitrarily controlling the atmosphere inside the storage container to be the same as the atmosphere inside the hopper, subsequently transferring the contents of the storage container to the hopper and then removing the storage container, the granular raw material can be added and supplied as desired even in the middle of the single-crystal production; therefore, the size of the hopper can be reduced.

Moreover, with the inside of the hopper being connected with the closed chamber in which the crystallization apparatus is arranged, since the atmosphere inside the hopper and the atmosphere of the closed chamber in which the crystallization apparatus is arranged are always the same, the granular raw material can be supplied stably. In addition, the atmosphere inside the hopper and the atmosphere inside the closed chamber can be optimally maintained in accordance with the properties of the material of the single crystal, so that a high-purity and high-quality single crystal can be produced.

It is noted here that the granular raw material supply apparatus including the hopper may also be arranged inside the closed chamber in the same manner as the granular raw material melting apparatus and the crystallization apparatus.

Yet still further, the single-crystal production equipment of the present invention is characterized in that the closed chamber is a water-cooling structure.

With the closed chamber being a water-cooling structure in this manner, deterioration of sealed parts and the like caused by an increase in the temperature of the closed chamber is inhibited and high-precision atmosphere control can thus be performed efficiently, so that a single crystal can be produced with good yield.

Yet still further, the single-crystal production equipment of the present invention is characterized in that the hopper is constituted by plural hoppers in which granular raw materials having different compositions are each stored.

In the case of strictly producing a single-crystal product having an optimum composition from the beginning of the single-crystal production, a hopper for a granular crystal base material and a hopper for a granular dopant may be separately arranged, and the granular raw material scraping equipment, the granular raw material quantitative supply equipment and the supply pipe may be connected to each of such hoppers.

Then, a dopant-free granular crystal base material and a granular dopant can be supplied while separately controlling their supply amounts to conform to the initial amount of a melt phase to be formed on the upper surface of the seed single crystal in the crucible. Moreover, by maintaining their compositions to correspond to that of the melt phase while adjusting their amounts in accordance with the amount of the melt phase that increases as the production proceeds, a uniform single crystal having an optimum composition can be produced.

In this case, there is an advantage that it is easy to allow the single-crystal product grown on the seed single crystal to uniformly have an optimum composition from the beginning.

Yet still further, the single-crystal production equipment of the present invention is characterized in that the granular raw material melting apparatus includes:

a granular raw material melting vessel which receives the granular raw material; and a vessel heating equipment which heats the granular raw material melting vessel and thereby melts the granular raw material in the granular raw material melting vessel.

Yet still further, the single-crystal production equipment of the present invention is characterized in that the granular raw material melting vessel includes:

a melting section where the granular raw material is heated and melted; and a melt retaining section where only a melt generated in the melting section is retained.

Yet still further, the single-crystal production equipment of the present invention is characterized in that the granular raw material melting vessel is constituted by:

a boat-shaped vessel; and a separation plate which divides the boat-shaped vessel into the melting section and the melt retaining section and includes a groove on a lower part.

Examples of embodiments of the melting vessel include a structure in which an elongated boat-shaped vessel is divided into a "melting section" and a "melt retaining section" by a separation plate having a groove arranged on a lower part and these sections are each controlled to have an optimum temperature such that, once a granular raw material is melted, the granular raw material remaining unmelted can be separated and only the resulting raw material melt can be dropped into to the crucible below.

In this structure, the granular raw material is melted on the outer side of the separation plate; however, the resulting raw material melt moves to the inner side through the groove arranged on a lower part of the separation plate, as a result of which only the raw material melt is discharged from a raw material melt outlet and dropped into to the crucible below.

Accordingly, when the specific gravity of the granular raw material is lower than that of the raw material melt obtained by melting the granular raw material, the granular raw material floats on the surface of the raw material melt, whereas when the specific gravity of the granular raw material is higher than that of the raw material melt, the granular raw material sinks to the lower part of the raw material melt, allowing the granular raw material to remain in the melt retaining section.

By constituting the melting vessel by a combination of a boat-shaped vessel and a separation plate in this manner, unmelted granular raw material can be prevented from being supplied as is into the crucible and only the raw material melt can be supplied into the crucible, so that a high-quality single crystal can be produced.

That is, in the process of melting the granular raw material and solidifying the resulting raw material melt as a single crystal, if unmelted granular raw material is incorporated into the raw material melt and adheres to the growth interface between the single crystal and the raw material melt to contaminate the resulting product, this causes the formation of negative crystals when the granular raw material has a small particle size or the generation of new microcrystals when the granular raw material has a large particle size, so that a polycrystal may be produced.

Therefore, it is indispensable that the melting vessel has a function of retaining unmelted granular raw material therein and dropping only completely melted raw material melt into the crucible below.

By this configuration, unmelted granular raw material is prevented from flowing out of the melting vessel through the outlet and thus retained inside the melting vessel.

Yet still further, the single-crystal production equipment of the present invention is characterized in that the granular raw material melting vessel is constituted by:

a melting dish; and a separation dish which is arranged inside the melting dish, has an inverted V-shaped cross-section and includes a groove on a lower part, and the granular raw material melting vessel is configured such that it is divided into the melting section and the melt retaining section between the melting dish and the separation dish.

Examples of other embodiments of the melting vessel include a two-layer structure (umbrella-like structure) in which a separation dish that has an inverted V-shaped cross-section and a groove on a lower part is arranged inside a melting dish. The "melting section" and the "melt retaining section" are formed between the melting dish and the separation dish.

Yet still further, the single-crystal production equipment of the present invention is characterized in that the granular raw material melting vessel is constituted by:

a cylindrical section; and a funnel-shaped section which is arranged inside the cylindrical section and has an opening at a lower end, and the inner side of the cylindrical section constitutes the melting section and a space between the outer side of the cylindrical section and the funnel-shaped section constitutes the melt retaining section.

In such a simple-type melting vessel, when the specific gravity of a granular raw material is lower than that of a raw material melt particularly as in the case of silicon, since unmelted granular raw material floats on the melt, hardly any granular raw material is let out of the melting vessel. Even if the granular raw material is let out, since the granular raw material floats on the melt, it is unlikely that the granular raw material is heated and melted by an infrared ray irradiated from above, adheres to the interface of the growing crystal and is thereby incorporated into the product; therefore, even with this simple-type melting vessel, a single crystal can be produced with good yield.

Yet still further, the single-crystal production equipment of the present invention is characterized in that the vessel heating equipment is a second infrared ray irradiation equipment.

As the vessel heating equipment for heating the melting vessel, a second infrared ray irradiation equipment can be used. For the heating of the melting vessel, an infrared ray may be irradiated to the melting vessel from above, a side, or obliquely below. The melting vessel may be irradiated from a combination of these directions as well.

Yet still further, the single-crystal production equipment of the present invention is characterized in that the vessel heating equipment is a high-frequency induction heating equipment.

As the vessel heating equipment for heating the melting vessel, a high-frequency induction heating equipment can be used. Moreover, the melting vessel may be placed in, for example, a carbon container, and this carbon container can be maintained at a high temperature using the high-frequency induction heating equipment to melt the granular raw material.

Yet still further, the single-crystal production equipment of the present invention is characterized in that the vessel heating equipment is a resistance heating equipment.

As the vessel heating equipment for heating the melting vessel, a resistance heating equipment can be used. For the production of a silicon single crystal, it is convenient to use a carbon resistance heating equipment.

Yet still further, the single-crystal production equipment of the present invention is characterized in that the granular raw material melting vessel includes a melting vessel rotating mechanism which rotates in the horizontal direction.

By incorporating a melting vessel rotating mechanism in this manner, particularly the granular raw material supplied into the melting vessel constituted by the melting dish and the separation dish can be uniformly heated.

Yet still further, the single-crystal production equipment of the present invention is characterized in that a part or the entirety of the granular raw material melting vessel is composed of platinum, iridium, quartz, silicon carbide, carbon, graphite, a carbon or graphite material whose surface has been converted to silicon carbide, or a carbon or graphite material whose surface has been coated with silicon carbide in advance.

With the melting vessel being composed of such a material, the granular raw material can be stably melted to generate the raw material melt. Particularly, for the production of a silicon single crystal, a melting vessel composed of a material obtained by converting the surface of a carbon material into silicon carbide can be suitably used.

Yet still further, the single-crystal production equipment of the present invention is characterized by including the above-described granular raw material supply apparatus in a plural number.

Yet still further, the single-crystal production equipment of the present invention is characterized by including the above-described granular raw material melting apparatus in a plural number.

By incorporating these apparatuses in a plural number, the production rate of a large single crystal can be increased.

Yet still further, the single-crystal production equipment of the present invention is characterized in that the single-crystal production crucible is configured such that a recess is formed on a central part of the bottom and the seed single crystal is arranged inside the recess.

With a recess being formed in this manner, at the time of forming a melt phase on the upper side of the seed single crystal arranged in the recess, although the upper side of the seed single crystal is melted, other parts are not melted and can thus be easily maintained as a solid single crystal. Accordingly, by allowing a solid to precipitate on this seed single crystal, the production of a single crystal can be continued.

Yet still further, the single-crystal production equipment of the present invention is characterized in that an auxiliary heating equipment is arranged on the outer side of the single-crystal production crucible.

By heating the entirety of the crucible to a temperature that is lower than the melting point of the granular raw material by approximately 100 to 300° C. and maintaining the crucible at this temperature using the auxiliary heating equipment, the dose of the infrared ray to be irradiated from the first infrared ray irradiation equipment used for the formation of a melt inside the crucible can be greatly reduced, and the controllability can be improved as well.

Yet still further, the single-crystal production equipment of the present invention is characterized in that a third infrared ray irradiation equipment, which heats the vicinity of the periphery of a melt and/or a mixed melt in the single-crystal production crucible, is arranged above the single-crystal production crucible.

Even if such a third infrared ray irradiation equipment is arranged and the position of the periphery of the melt phase is changed due to an increase in the amount of the melt phase in the crucible, as long as the vicinity of the periphery can be heated in accordance with the change, generation or growth of microcrystals from the vicinity of the periphery can be inhibited.

Accordingly, the formation of a polycrystal caused by coexistence of other microcrystals in the single crystal on the center of the crucible can be inhibited.

It is preferred that the temperature of the vicinity of the periphery of the melt phase in the crucible, which is raised by the third infrared ray irradiation equipment, beat least 3° C. higher than the average melt temperature in the entire crucible.

Yet still further, the single-crystal production equipment of the present invention is characterized in that the third infrared ray irradiation equipment includes an irradiation position adjusting mechanism for aligning the changing position of the periphery of the melt phase and the irradiation position.

The diameter of the melt phase that is formed on the seed single crystal placed on a central part of the inclined bottom of the crucible increases as the growth of a crystal. The position of the periphery of the melt phase changes until it reaches the vertical wall section of the crucible; however, by the irradiation position adjusting mechanism of the third infrared ray irradiation equipment, an infrared can be constantly irradiated to the periphery of the melt phase, and the vicinity of the periphery can thus be maintained to have a high temperature.

As a result, the growth of microcrystals generated from release agent-coated parts can be inhibited, so that a high-quality single crystal can be produced.

Yet still further, the single-crystal production equipment of the present invention is characterized in that the bottom of the single-crystal production crucible is inclined downward toward the center.

With the bottom of the crucible being inclined downward toward the center, the size of the resulting single crystal can be gradually increased from the seed single crystal placed on the center of the bottom in the crucible toward the vertical wall section. When the inclination angle is excessively small, the likelihood of other microcrystals being formed in the middle is increased. Meanwhile, when the inclination angle is excessively large, since the solidified product obtained before the solidification reaches the vertical wall section has a non-standard size, the product yield as a whole is deteriorated.

As for the inclination angle of the bottom of the crucible, it is preferred that the bottom of the crucible be inclined downward toward the center at an angle in a range of 3 to 60 degrees.

Yet still further, the single-crystal production equipment of the present invention is characterized in that the inner wall of the single-crystal production crucible is coated with a release agent.

Particularly, in the production of a silicon single crystal, by coating the inner wall of the crucible with a release agent, the generation of cracks during cooling of the resulting large single crystal can be inhibited.

Yet still further, the single-crystal production equipment of the present invention is characterized in that a carbon holder is arranged on the outer side of the single-crystal production crucible.

Particularly, when the material of the crucible is quartz, it is preferred to arrange the carbon holder on the outer side of the quartz crucible. By arranging the carbon holder, the quartz crucible on the inner side can be used stably.

Yet still further, the single-crystal production equipment of the present invention is characterized in that the single-crystal production crucible includes a crucible rotating mechanism which rotates in the horizontal direction.

With the crucible being rotatable, the surface temperature of the melt phase being formed can be easily maintained constant at all times, so that the temperature unevenness caused by heating can be reduced also when heating the vicinity of the periphery of the melt phase.

Yet still further, the single-crystal production equipment of the present invention is characterized in that the single-crystal production crucible includes an elevator apparatus which moves in the vertical direction at a prescribed speed.

With the crucible being movable in the vertical direction in this manner, the surface of the melt phase being formed can be always maintained at a certain position, so that the distance between an infrared ray irradiation equipment and the surface of the melt phase can be maintained constant at all times.

Yet still further, the single-crystal production equipment of the present invention is characterized in that the above-described first infrared ray irradiation equipment, second infrared ray irradiation equipment and third infrared ray irradiation equipment are laser irradiation equipments.

The use of laser irradiation equipments irradiating laser light in this manner can contribute to downsizing and improvement in operability of the single-crystal production equipment.

Yet still further, the single-crystal production equipment of the present invention is characterized in that the first infrared ray irradiation equipment, the second infrared ray irradiation equipment and the third infrared ray irradiation equipment each include:

an elliptical reflector whose inner surface is used as a reflection surface; and an infrared lamp which is arranged at a first focus position on the bottom side of the elliptical reflector.

By using infrared ray irradiation equipments configured in this manner, an infrared ray can be efficiently irradiated.

Yet still further, the single-crystal production equipment of the present invention is characterized in that the infrared lamp is a halogen lamp or a xenon lamp.

Since a halogen lamp or a xenon lamp can be obtained inexpensively, the production cost of the single-crystal production equipment can be reduced.

Yet still further, the single-crystal production equipment of the present invention is characterized in that the first infrared ray irradiation equipment, the second infrared ray irradiation equipment and the third infrared ray irradiation equipment are each arranged in a plural number.

By incorporating these infrared ray irradiation equipments in a plural number in this manner, as compared to a case where these equipments are each arranged singly, the melting of the granular raw material and the production of a single crystal can be more stably and surely performed. In addition, by arranging these equipments each in a plural number, the surface of the melt phase in the crucible can be heated uniformly.

By uniformly heating the surface of the melt phase in the crucible, the resulting solid-liquid interface can be made flat, so that a single-crystal product having a uniform dopant concentration in both the vertical and horizontal directions can be produced.

For example, by arranging the third infrared ray irradiation equipment in a plural number in conformity to the periphery of the substantially circular melt phase, the temperature of the periphery can be preferably increased and controlled when the periphery of the melt phase is heated, so that the occurrence of temperature unevenness can be certainly inhibited.

Yet still further, the single-crystal production equipment of the present invention is characterized in that infrared ray transmitting windows, which transmit the above-described infrared ray, are arranged between the single-crystal production crucible and granular raw material melting vessel and each of the first, second and third infrared ray irradiation equipments.

With the infrared ray transmitting windows being arranged in this manner, even if the raw material melt is evaporated in the crucible, the resulting evaporant does not reach the respective infrared ray irradiation equipments; therefore, the single-crystal production equipment can be stably used over a long period without reduction in the intensity of the infrared ray.

In such a case where the evaporant adheres to the infrared ray transmitting windows, it is preferred to arrange an evaporant adhesion-inhibiting apparatus on the periphery of each infrared ray transmission window. As the evaporant adhesion-inhibiting apparatus, for example, an atmosphere gas may be sprayed to each infrared ray transmitting window.

The single-crystal production method of the present invention is a single-crystal production method of producing a large single crystal by melting a granular raw material which has an optimum dopant composition of a single-crystal material to be produced using a granular raw material melting apparatus, supplying the thus obtained raw material melt into a single-crystal production crucible below, and allowing a single crystal to precipitate as a solid on a seed single crystal placed in the single-crystal production crucible, wherein the single-crystal production method includes, at least, the steps of:

supplying a required amount of the granular raw material to the granular raw material melting apparatus via a granular raw material supply apparatus arranged above the single-crystal production chamber;

preparing a raw material melt by melting the granular raw material thus supplied to the granular raw material melting apparatus using the granular raw material melting apparatus, and supplying the thus obtained raw material melt into the single-crystal production crucible below; and irradiating the upper surface of the seed single crystal placed on the bottom of the single-crystal production crucible with an infrared ray to form a melt, and heating only the periphery of the resulting melt phase to maintain the temperature of the periphery of the melt phase to be higher than non-peripheral parts of the melt phase and to thereby allow a single crystal to precipitate as a solid on the seed single crystal from a lower side of a mixed melt phase generated by dropping the raw material melt into the melt phase.

The single-crystal production method of the present invention is characterized in that the granular raw material is composed of a granular crystal base material and a granular dopant.

Further, the single-crystal production method of the present invention is characterized in that, during production of a dopant-doped single crystal, the intensity of the infrared ray irradiated to the upper surface of the seed single crystal is controlled such that the melt formed on the seed single crystal has a prescribed thickness at all times.

The steps of producing an N-type silicon single crystal doped with phosphorus at an optimum composition will now be described as an example.

In the step of supplying a granular raw material to a granular raw material melting apparatus, a dopant-free silicon granular raw material and a phosphorus-doped granular raw material whose average composition has a phosphorus concentration of 10 times higher than an optimum dopant concentration are mixed to prepare a granular raw material having an optimum composition, and this granular raw material is stored in a hopper.

A granular raw material scraping equipment and a granular raw material quantitative supply equipment are put into operation, and a prescribed amount of the granular raw material is supplied from the hopper through a supply pipe into a melting vessel of a granular raw material melting apparatus arranged therebelow.

In the step of supplying a raw material melt into a crucible below, first, the granular raw material supplied to the granular raw material melting apparatus is melted using the granular raw material melting apparatus to form the raw material melt.

In the granular raw material melting apparatus, the melting vessel is heated by a vessel heating equipment to melt the granular raw material supplied from above.

Alternatively, the melting vessel is heated in advance by irradiating thereto an infrared ray from above or from above and a side, and the granular raw material is added to this heated melting vessel from above and then melted. Subsequently, only the resulting raw material melt is dropped into the crucible below.

Next, in the step of allowing a single crystal to precipitate, the granular raw material in an amount required for the formation of a melt phase is arranged on the seed single crystal placed on a central part of the crucible, after which the inside of the closed chamber is vacuum-evacuated and argon gas is subsequently introduced thereto.

Further, an auxiliary heating equipment arranged on the outer side of the crucible is put into operation and, once the crucible is heated to a prescribed temperature, a first infrared ray irradiation equipment for heating the inside of the crucible is operated while maintaining the inside of the closed chamber under a prescribed reduced pressure and rotating the crucible, whereby a melt phase is formed. The vicinity of the periphery of the thus formed melt phase is heated by irradiating thereto an infrared ray from the third infrared ray irradiation equipment.

Then, the raw material melt starts to be dropped into the crucible from above, and the position of the crucible is lowered as a solid precipitates in an amount conforming to the dropped amount.

A joystick is brought down into the crucible from an upper part of the closed chamber to measure the position of the solid below the melt phase and, while checking the thickness of the melt phase, the dose of the irradiated infrared ray is controlled such that the thickness is maintained constant at all times.

Once the addition of the prescribed granular raw material is completed, the operations of the granular raw material scraping equipment, granular raw material quantitative supply equipment, melting vessel rotating mechanism and vessel heating equipment are terminated, the lowering of the crucible is stopped, and the output of the first infrared ray irradiation equipment for heating the crucible is slowly reduced, whereby the melt phase is allowed to solidify completely.

Thereafter, the irradiation of infrared ray is terminated and, once the crucible is cooled to room temperature over a prescribed cooling period by controlling the auxiliary heating equipment arranged on the outer side of the crucible, all of the operating components are stopped, and a door of the closed chamber is opened to take out a single-crystal product.

That is, although the infrared ray is absorbed by the raw material melt in the crucible and converted into heat and the raw material melt is thereby heated, since the amount of the infrared ray that reaches the lower part of the melt gradually decreases due to the absorption of the infrared ray, the amount of the infrared ray converted into heat also decreases, so that an increase in temperature is suppressed.

This single-crystal production method has the same basic principles as so-called "Bridgman method" which produces a large single crystal using a seed single crystal. In the Bridgman method, however, since a raw material is entirely melted first and then a single crystal formation is allowed to proceed in the upward direction from the bottom of a crucible, the dopant concentration of a product varies in the vertical direction due to segregation.

In the single-crystal production method of the present invention, a melt phase is formed by irradiating the inside of the crucible with an infrared ray. In this process, the upper side has a higher temperature than the lower side, and the temperature of a solid-liquid interface between the melt phase and the single crystal on the lower side is the same as the temperature at which a solid phase precipitates from the melt phase.

When the thickness of a mixed melt phase generated by supplying the raw material melt to the melt phase formed in this manner is increased, the amount of the infrared ray reaching the lower part of the mixed melt phase decreases due to absorption of the infrared ray by the mixed melt phase, as a result of which the temperature is decreased and a solid phase starts to precipitate out of the mixed melt phase.

In this manner, supply of the granular raw material to the melting vessel, melting of the granular raw material, dropwise addition of the resulting melt into the crucible, and precipitation of a solid phase from the mixed melt phase in the crucible (i.e., growth of a single crystal) are continuously carried out and, once the supply of the prescribed granular raw material to the melting vessel is completed, the dose of the infrared ray is gradually reduced. Then, after the remaining mixed melt phase is completely solidified, the entire chamber is cooled to room temperature, and a product is taken out.

As a result, a high-quality large single crystal which has a uniform dopant concentration with an optimum composition in both the vertical and horizontal directions can be obtained.

For the production of a single crystal having a uniform composition by this production method, it is required that the composition, the amount and the temperature of the mixed melt phase all be maintained constant. When the temperature is much higher than a prescribed temperature, the thickness of the mixed melt phase is increased, whereas when the temperature is excessively low, the thickness of the mixed melt phase is reduced. Still, when the irradiation dose of the infrared ray is maintained constant, since the thickness of the mixed melt phase is approximately 20 to 30 mm at most, a steady state conforming to the temperature condition is immediately established.

In a steady state, a single crystal whose composition and amount conform to those of the added raw material melt is solidified; therefore, the resulting single crystal is allowed to uniformly have a prescribed composition. This is the best advantage of this production method and shows that the production method has extremely high controllability.

Furthermore, in the final stage of the crystal production, i.e., after the completion of the addition of the granular raw material to the melting vessel, the dopant concentration of the parts where remaining mixed melt phase is solidified gradually increases and is not uniform; however, since such parts have a thickness of approximately 30 mm at most, deterioration of the product yield as a whole can be inhibited.

According to the single-crystal production equipment and single-crystal production method of the present invention, a large single crystal which uniformly has an optimum-concentration composition in both the vertical and horizontal directions can be produced by supplying a granular raw material uniformly containing a dopant having an optimum composition at a prescribed rate.

In addition, by not only maintaining the granular raw material melting vessel to have an optimum temperature but also configuring the granular raw material melting vessel to have a melting section and a melt retaining section, unmelted granular raw material can be prevented from being supplied into the crucible.

With unmelted granular raw material being mixed in the raw material melt, when the granular raw material has a sufficiently small size, the crystal growth may be suppressed in those parts where the granular raw material adhered to the crystal growth interface, and negative crystals may be formed as a result. Meanwhile, when the granular raw material has a large size, new microcrystals grow therefrom, so that a polycrystal may be generated as a whole.

Therefore, from the standpoint of obtaining a best-quality single crystal, it is extremely important to configure the granular raw material melting vessel to have a melting section and a melt retaining section and to thereby prevent unmelted granular raw material from being supplied into the crucible.

BRIEF DESCRIPTION OF DRAWINGS

FIG. 1 is a schematic view showing a single-crystal production equipment according to one embodiment of the present invention;

FIG. 2 is a schematic view showing a single-crystal production equipment according to another embodiment of the present invention;

FIG. 3 is a schematic view showing a boat-type granular raw material melting vessel according to one embodiment of the present invention;

FIG. 4 is a schematic view showing a granular raw material melting vessel having a two-layer structure (umbrella-like structure) according to another embodiment of the present invention;

FIG. 5 is a schematic view showing a simple-type granular raw material melting vessel according to yet another embodiment of the present invention.

DESCRIPTION OF EMBODIMENTS

Figure 6A:
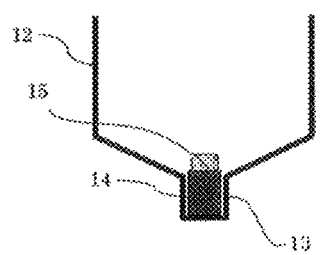
FIG. 6 is a set of drawings showing the production steps of a single crystal using the single-crystal production equipment of the present invention.

Embodiments (examples) of the present invention will now be described in more detail based on the drawings.

The single-crystal production equipment and single-crystal production method according to the present invention are used for highly efficiently producing a large single crystal of, for example, 1,000 to 2,000 mm or larger in diameter, while homogenizing its composition to be optimum.

The term "seed single crystal" used herein refers to an initial form of a crystal in the production of a large-diameter single crystal using a single-crystal production equipment. A crystal which is grown from this seed single crystal and maintains the same orientation in its entirety is referred to as "single crystal". In contrast, an aggregate of single crystals each having a different orientation is referred to as "polycrystal".

In the case of a polycrystal, individual single crystals have different crystal orientations at their boundaries, and this leads to disadvantages such as reduction in the power generation efficiency. Therefore, a high-performance silicon substrate is desired to be a single crystal which entirely has the same orientation and thus does not contain such crystal grain boundaries.

Further, the term "granular raw material" used herein refers to a powderized (granulated) raw material from which a single crystal is produced. It is noted here that the term "granular raw material" encompasses granular crystal base materials and granular dopants.

In the production of a dopant-containing single crystal, the dopant concentration in the resulting crystal does not agree with the composition of a melt from which the crystal (solid) having this concentration precipitates, and the ratio between the dopant concentration in a melt and that in a solid precipitating from the melt is referred to as "distribution coefficient". When silicon is used along with phosphorus as a dopant, the distribution coefficient of phosphorus is approximately 0.35.

Further, in the drawings, the size and the shape of the particles representing the granular raw material as well as the size and the shape of the droplets representing a raw material melt 67 are not particularly restricted.

<Single-Crystal Production Equipment 10>

As shown in FIG. 1, a single-crystal production equipment 10 of the present Example assumes a case of producing a silicon single crystal having an optimum dopant composition.

In the single-crystal production equipment 10, a crucible table 19, a crucible rotating mechanism 20 and a crucible vertical movement mechanism 22 are arranged on the bottom of a closed chamber 11 which can be vacuum-evacuated and retain an inert gas atmosphere such as argon gas. On the crucible table 19, a quartz crucible 12 made of quartz is arranged as a single-crystal production crucible having a substantially circular cross-section, and a carbon holder 16 which mechanically holds the quartz crucible 12 is arranged on the outer side of the quartz crucible 12.

Further, on the outer side of the carbon holder 16, an auxiliary heating equipment 17 which heats the quartz crucible 12 is arranged, and an insulating material 18 is arranged on the outer side of the auxiliary heating equipment 17. The closed chamber 11 is a water-cooling structure which is capable of efficiently controlling the inner atmosphere.

Meanwhile, in the upper part of the closed chamber 11, a hopper 33 which stores a granular raw material 52 is arranged. The hopper 33 has an opening on its lower part, and a spiral rod (not shown), which is equipped with a rotating mechanism and coated with polypropylene, is arranged inside the hopper 33 and rotated at all times during use. By rotating this spiral rod, the occurrence of a so-called cavitation phenomenon where a cavity is created in the granular raw material 52 stored in the hopper 33 and stable supply of the granular raw material 52 is thereby made no longer possible can be inhibited.

The opening on the lower part of the hopper 33 is directly connected to the closed chamber 11, and the hopper 33 and the closed chamber 11 are configured in such a manner to have the same internal atmosphere at all times.

Moreover, on a lateral side of the opening of the hopper 33, a granular raw material scraping equipment (hereinafter, also simply referred to as "scraping equipment") 48 is arranged. This scraping equipment 48 includes a propylene-coated receptacle having a spoon-like shape that is attached to a tip of a rod, and it is configured such that, by inserting this rod to the opening of the hopper 33 and then pulling out and half-rotating the rod with the granular raw material 52 being placed in the receptacle, the granular raw material 52 in the receptacle can be supplied onto a granular raw material quantitative supply equipment (hereinafter, also simply referred to as "quantitative supply equipment") 50 positioned underneath the hopper 33.

The quantitative supply equipment 50 adjusts the amount of the granular raw material 52 to be supplied while measuring the weight thereof and supplies a prescribed amount of the granular raw material 52 to a supply pipe 51 therebelow which has a supply position adjusting function. In the drawing, a symbol 60 represents a position adjusting mechanism.

The hopper 33 in this embodiment stores a granular mixture obtained by mixing dopant-free granular silicon and a granular raw material doped with a dopant at a high concentration such that the granular mixture has an optimum composition, and this enables to surely maintain the composition ratio of the granular raw material 52 constant.

In this embodiment, the hopper 33 is used singly; however, the configuration is not restricted to this mode and, for example, a hopper for storing the dopant-free granular silicon and a hopper for storing the granular raw material doped with a dopant at a high concentration may be separately arranged.

At the upper end of such hopper 33, a known attachment-detachment mechanism. 46 is arranged such that a storage container 47 which stores the granular raw material 52 can be attached and detached as desired. The attachment-detachment mechanism 46 includes an atmosphere controlling function for arbitrarily controlling the atmospheres inside the attachment-detachment mechanism 46 and the storage container 47. FIG. 1 shows a state where the storage container 47 is detached from the hopper 33.

By using the storage container 47 that can be attached to and detached from the hopper 33 in this manner, the granular raw material 52 can be supplied to the hopper 33 at any time as required even in the midst of operating the single-crystal production equipment 10 to produce a single crystal. Therefore, it is not necessary to use a large hopper 33, and a reduction in the size of the single-crystal production equipment 10 can be realized.

The granular raw material 52 supplied from the scraping equipment 48 is supplied to a prescribed position of a granular raw material melting vessel (hereinafter, also referred to as "melting vessel") 62 of a granular raw material melting apparatus through the supply pipe 51 in a prescribed amount using the quantitative supply equipment 50 which has a function of adjusting the supply amount while measuring the weight.

To the supply pipe 51, the position adjusting mechanism 60, which adjusts the position of an outlet at the lower end of the supply pipe 51, is attached.

It is preferred that the melting vessel 62, which melts the granular raw material 52, have a multi-section structure divided into a "melting section" where the granular raw material 52 is melted and a "melt retaining section" where the resulting melt is retained; and that the melting vessel 62 have a function of preventing unmelted granular raw material 52 from being supplied downward along with the raw material melt 67.

As for the shape of the melting vessel 62, for example, such a boat-type melting vessel 62 as shown in FIGS. 1 and 3 or such a melting vessel 62 having a two-layer structure (umbrella-like structure) as shown in FIGS. 2 and 4 can be utilized. Further, in the case of producing a silicon single crystal, such a simple-type melting vessel 62 as shown in FIG. 5 can be utilized as well.

First, in the boat-type melting vessel 62, as shown in FIG. 3, a boat-shaped vessel 61 which receives the granular raw material 52 supplied from the supply pipe 51 is fitted inside a high-frequency induction heating equipment 55. A separation plate 63 having a groove 66 on a lower part is arranged inside the boat-shaped vessel 61, and the boat-shaped vessel 61 is divided by the separation plate 63 into the "melting section" and the "melt retaining section".

The granular raw material 52 to be supplied to the boat-shaped vessel 61 through the supply pipe 51 may be directly supplied into the boat-shaped vessel 61; however, it is preferred to supply the granular raw material 52 into the boat-shaped vessel 61 using a funnel for granular raw material 53 since this makes it easier to supply the granular raw material 52 at a prescribed position.

By induction heating performed by the high-frequency induction heating equipment 55, the temperature of the boat-shaped vessel is increased, and the granular raw material 52 is thereby heated and melted, as a result of which only the thus formed raw material melt 67 moves to an adjacent section (the section on the right in FIG. 3) through the groove 66 on the lower part of the separation plate 63 and is retained therein. It is noted here that the granular raw material 52 is rapidly melted at a temperature that is at least 100° C. higher than the melting point of a silicon granular raw material.

At this point, when the granular raw material 52 has a lower specific gravity than the raw material melt 67, since the granular raw material 52 floats on the raw material melt 67, the granular raw material 52 is prevented from passing through the groove 66 below. On the other hand, when the specific gravity of the granular raw material 52 is higher than that of the raw material melt 67, the granular raw material 52 stays in a lower part of the raw material melt 67.

Once the raw material melt 67 retained in the boat-shaped vessel 61 has reached the height of an outlet 68 arranged on the boat-shaped vessel 61, the raw material melt 67 flows to the outside through the outlet 68 and is thereby dropped into the quartz crucible 12 below. The raw material melt 67 discharged from the outlet 68 may be dropped into the quartz crucible 12 below through a funnel for raw material melt 54 as shown in FIG. 3.

In this case, in the boat-type melting vessel 62, the unmelted granular raw material 52 can be prevented from being dropped along with the raw material melt 67.

Further, in the single-crystal production equipment 10, even when the unmelted granular raw material 52 remains in the raw material melt 67 to be dropped into the quartz crucible 12, a mixed melt of the raw material melt 67 and a melt formed on the seed single crystal 14 can be formed eventually. On the seed single crystal 14 as well, the unmelted granular raw material 52 exists floating on the melt and is irradiated with an infrared ray from above, so that the unmelted granular raw material 52 is completely melted and disappears.

Consequently, it is extremely unlikely that the unmelted granular raw material 52 sinks to a lower part of the melt and adheres to the interface between the growing single crystal and the melt to be incorporated into the single crystal and form negative crystals or to cause the generation of new microcrystals.

Meanwhile, as shown in FIG. 4, the melting vessel 62 having a two-layer structure (umbrella-like structure) is constituted by a melting dish 64 and a separation dish 65 which is disposed thereon in such a manner to have an inverted V-shaped cross-section, and this melting vessel 62 is configured in such a manner to be divided between the melting dish 64 and the separation dish 65 into a melting section where the granular raw material 52 is melted and a melt retaining section where the resulting raw material melt 67 is retained.

As vessel heating equipments for heating the granular raw material 52 supplied to the melting dish 64, as shown in FIG. 2, second infrared ray irradiation equipments 72 and 82 are used, and infrared rays 74 and 85 are irradiated to the melting vessel 62 from these second infrared ray irradiation equipments 72 and 82.

It is preferred that the second infrared ray irradiation equipments 72 and 82 be arranged above and on a side of the melting vessel 62 as shown in FIG. 2, respectively; however, they may both be arranged either above or on a side of the melting vessel 62. As the second infrared ray irradiation equipments 72 and 82, laser irradiation equipments are preferably used; however, other than laser irradiation equipments, the second infrared ray irradiation equipments 72 and 82 may also be resistance heating equipments (particularly, carbon resistance heating equipments in the case of producing a silicon single crystal), or irradiation apparatuses configured such that, for example, an infrared ray emitted from an infrared lamp is reflected by the inner surface of an elliptical reflector. In this case, as the infrared lamp, a halogen lamp, a xenon lamp or the like can be used.

In the melting vessel 62 having a two-layer structure (umbrella-like structure), by the infrared rays irradiated from the second infrared ray irradiation equipments 72 and 82, the granular raw material 52 is heated and melted, and only the resulting raw material melt 67 moves to the central part through a groove 66 arranged at the lower end of the separation dish 65 and is retained in the separation dish 65.

At this point, when the granular raw material 52 has a lower specific gravity than the raw material melt 67, since the granular raw material 52 floats on the raw material melt 67, the granular raw material 52 is prevented from passing through the groove 66 below.

On the other hand, when the specific gravity of the granular raw material 52 is higher than that of the raw material melt 67, the granular raw material 52 stays in a lower part of the raw material melt 67.

The raw material melt 67 retained in the separation dish 65 remains in the central part and, once the raw material melt 67 has reached the height of an outlet 68 arranged on a pipe in the central part, the raw material melt 67 flows into the pipe through the outlet 68 and is thereby dropped into the quartz crucible 12 below. In this process, the unmelted granular raw material 52 can be prevented from dripping down along with the raw material melt 67.

Further, as shown in FIG. 5, the simple-type melting vessel 62 stores the granular raw material 52 supplied from the upper end and is constituted by a cylindrical section 57, whose lower end is inserted into a mixed melt 91 on the upper surface of the seed single crystal 14 in the quartz crucible 12, and a funnel-shaped section 58, which is arranged inside the cylindrical section 57 and has an opening at the lower end.

In this simple-type melting vessel 62, particularly as in the case of silicon, when the specific gravity of the granular raw material 52 is lower than that of the raw material melt 67, since the unmelted granular raw material 52 floats on the melt in the cylindrical section 57, hardly any granular raw material 52 is let out of the melting vessel 62.

Even if the granular raw material 52 is let out, since the granular raw material 52 floats on the melt, it is unlikely that the granular raw material 52 is heated and melted by an infrared ray irradiated from above, adheres to the interface of the growing crystal and is thereby incorporated into the product.

As vessel heating equipments for heating this melting vessel 62, the second infrared ray irradiation equipments 72 and 82 may be used as in the case of the melting vessel 62 having a two-layer structure (umbrella-like structure) shown in FIG. 2.

As the material of the above-described boat-type melting vessel 62, melting vessel 62 having a two-layer structure (umbrella-like structure) and simple-type melting vessel 62, for example, platinum, iridium, quartz, silicon carbide, carbon, graphite, a carbon or graphite material whose surface has been converted to silicon carbide, or a carbon or graphite material whose surface has been coated with silicon carbide in advance can be selected and used for the entirety or a part of each melting vessel 62.

The melting vessel 62 having a two-layer structure (umbrella-like structure) has a function of being rotated in the horizontal direction by a melting vessel rotating mechanism 70. By rotating the melting vessel 62 having a two-layer structure (umbrella-like structure) in this manner, the granular raw material 52 is evenly supplied from the supply pipe 51 into the melting vessel 62, so that the granular raw material 52 can be surely melted.

On the bottom of the quartz crucible 12 arranged below the melting vessel 62 in the closed chamber 11, a slope inclined downward toward the center is formed, and a recess 13 for storing the seed single crystal 14 is arranged on the center of the bottom of the quartz crucible 12.

The slope formed on the bottom of the quartz crucible 12 is inclined downward toward the center at an angle of 3 to 60 degrees (inclination angle), preferably at an angle of 5 to 30 degrees (inclination angle). The smaller this slope (inclination angle), the more likely it is that other crystal starts to grow in the middle. Meanwhile, when the slope (inclination angle) is excessively large, the product obtained between the center and the vertical wall section of the quartz crucible 12 has a non-standard size, so that the product yield is deteriorated.

Further, the recess 13 arranged on the center of the bottom of the quartz crucible 12 preferably has, for example, an inner diameter of approximately 20 cm and a height of approximately 20 cm. An upper part of the seed single crystal 14 placed therein is melted by irradiation with an infrared ray 28 coming from above; however, a lower part is maintained unmelted. By adjusting the melting range in this manner such that the seed single crystal 14 remains without being completely melted, a single crystal is allowed to continuously grow only from the remaining seed single crystal 14, whereby a large single crystal can be produced.

In this embodiment, the quartz crucible 12 is used as a single-crystal production crucible; however, the crucible material is selected in accordance with the material of the single crystal to be produced and, other than quartz, for example, platinum, molybdenum, iridium and carbon can be used. Particularly, for the production of a silicon single crystal, a quartz crucible 12 whose inside is coated with a release agent is used as in this embodiment.

The crucible table 19 on which the quartz crucible 12 is arranged is rotated at a prescribed speed by the crucible rotating mechanism 20, whereby uneven irradiation of the infrared ray into the quartz crucible 12 can be reduced, and a melt phase formed in the quartz crucible 12 is thus allowed to have uniform temperature.

Further, by the crucible vertical movement mechanism 22 of the crucible table 19, the height position of the melt phase formed in the quartz crucible 12 can be controlled to be optimal at all times.

The upper surface of the seed single crystal 14 arranged in the quartz crucible 12 is melted by the infrared ray 28 irradiated from a first infrared ray irradiation equipment (laser irradiation equipment in this embodiment) 26, as a result of which a melt phase is formed.

Moreover, in the case of producing a single crystal of a dopant-containing material, using a raw material adjusted to have an optimum dopant concentration, a required amount of a raw material lump adjusted to have the composition of a melt phase that coexists with a solid having this optimum dopant concentration in an equilibrium state is arranged on the seed single crystal 14, and a mixed melt phase is formed first by melting together the raw material lump and an upper part of the seed single crystal 14, after which a mixed melt is further formed by dropping the raw material melt 67 to the mixed melt phase so as to initiate and continuously perform the single-crystal production, whereby a desired single crystal having a uniform composition can be produced.

In this process, the mixed melt phase formed on the seed single crystal 14 arranged in the quartz crucible 12 maintains a constant thickness in accordance with the slope of the bottom of the quartz crucible 12 and, as the single-crystal production continues, the position of the periphery of the mixed melt phase moves to a position away from the center.

On an upper part of the closed chamber 11, a third infrared ray irradiation equipment (laser irradiation equipment in this embodiment) 30 for local heating is arranged. The irradiation position of the third infrared ray irradiation equipment 30 is controlled such that the irradiation position of an infrared ray 32 irradiated from the third infrared ray irradiation equipment 30 conforms to the position shift of the periphery of the mixed melt phase. By this, the periphery of the mixed melt phase formed in the quartz crucible 12 can be maintained to have a temperature higher than the ambient temperature.

It is noted here that, as shown in FIGS. 6(A) to 6(F), the periphery of the mixed melt 91 is positioned in the vicinity of the center of the crucible in the initial stage of the single-crystal production; however, it moves toward the outside as the progress of the single-crystal production, and establishes a steady state once it reaches the vertical wall section of the quartz crucible 12.

Accordingly, the third infrared ray irradiation equipment 30 for local heating has a function of aligning its irradiation position with the position of the moving periphery of the mixed melt phase.

Meanwhile, between the quartz crucible 12 and each of the infrared ray irradiation equipments 26, 30, 72 and 82, infrared ray transmitting windows 27, 31, 73 and 84 are arranged, respectively. The material of these infrared ray transmitting windows 27, 31, 73 and 84 is not particularly restricted as long as it can transmit infrared rays; however, the infrared ray transmitting windows 27, 31, 73 and 84 are preferably made of, for example, quartz.

The single-crystal production equipment 10 of the present invention is configured as described above, particularly in such a manner that the granular raw material 52 is converted into the raw material melt 67 using the boat-type melting vessel 62, the melting vessel 62 having a two-layer structure (umbrella-like structure) or the simple-type melting vessel 62 and only the raw material melt 67 is supplied into the quartz crucible 12; therefore, the single-crystal production equipment 10 is capable of producing a large single crystal with no crystal grain boundary, which is a high-quality single crystal that has a uniform composition in both the vertical and horizontal directions at an optimum dopant concentration and contains only a small number of negative crystals and exsolution lamellae.

<Single-Crystal Production Method>

A single-crystal production method using the single-crystal production equipment 10 of the present invention will now be described.

As shown in FIG. 6(A), the quartz crucible 12 is arranged in the closed chamber 11. The inner surface of the quartz crucible 12 is coated with a release agent. By this, crack generation in a silicon single crystal to be eventually produced can be inhibited.

First, a silicon seed single crystal 14 is arranged in the recess 13 arranged in the vicinity of the center on the bottom of the quartz crucible 12 and, on this seed single crystal 14, a granular raw material lump 15 having a composition and an amount that are required for the formation of a melt phase coexisting with a solid having an optimum dopant concentration is arranged.

The closed chamber 11 is hermetically sealed, and the atmosphere inside the closed chamber 11 is vacuum-evacuated by a gas evacuation unit (not shown), followed by introduction of an inert atmosphere, such as argon gas, into the closed chamber 11.

Meanwhile, the quartz crucible 12 starts to be heated by the auxiliary heating equipment 17, as a result of which the outer circumference of the quartz crucible 12 is heated to a temperature of approximately 1,300° C. In this process, since the auxiliary heating equipment 17 is arranged slightly away from the recess 13 of the quartz crucible 12, the seed single crystal 14 is not subjected to a large amount of heat.

Figure 6B:
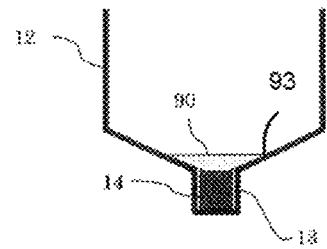

Next, as shown in FIG. 6(B), a melt phase 90 is formed by irradiating the infrared ray 28 to the seed single crystal 14 on the center of the quartz crucible 12 from the first infrared ray irradiation equipment 26. In this process, the irradiation intensity of the infrared ray 28 is adjusted such that the upper surface of the seed single crystal 14 is also melted together.

After the formation of the melt phase 90, the vicinity of the periphery 93 of the melt phase 90 is irradiated with the infrared ray 32 emitted from the third infrared ray irradiation equipment 30 so as to maintain the vicinity of the periphery 93 to have a temperature that is at least 3° C. higher than the ambient temperature.

The granular raw material scraping equipment 48, the quantitative supply equipment 50 and the second infrared ray irradiation equipments 72 and 82, which are arranged above, are put into operation so as to scrape the granular raw material 52 having an optimum composition out of the hopper 33, feed the granular raw material 52 into the melting vessel 62 through the supply pipe 51 at a prescribed rate, and drop the resulting raw material melt 67 into the quartz crucible 12.

A mixed melt 91 is formed by the thus dropped raw material melt 67 and the melt formed on the seed single crystal 14. When the thickness of this mixed melt 91 is increased to a prescribed thickness, since the infrared ray 28 irradiated from the first infrared ray irradiation equipment 26 is unlikely to reach therebelow, the temperature in the vicinity of a solid-liquid interface underneath the mixed melt 91 is lowered.

Figure 6C:
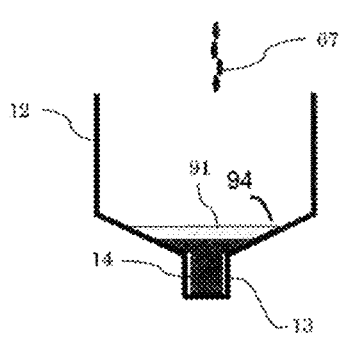

As a result, as shown in FIG. 6(C), precipitation of a solid phase from the mixed melt 91 formed on the upper surface of the seed single crystal 14 arranged in the recess 13 of the quartz crucible 12, i.e., production of a single crystal 92, begins. At this point, by irradiating the vicinity of the periphery 94 of the mixed melt 91 formed on the upper surface of the seed single crystal 14 with the infrared ray 32 emitted from the third infrared ray irradiation equipment 30, it is continuously devised that the generation of microcrystals from a part other than the seed single crystal 14 is inhibited or, even if microcrystals are generated, the growth thereof is suppressed and the growth of single crystal predominantly takes place.

Figure 6D:
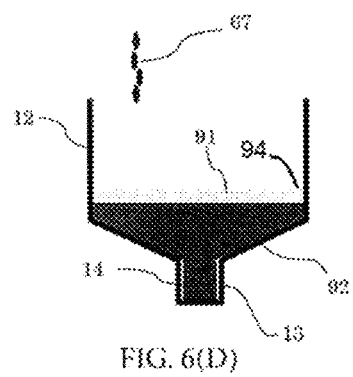

Further, as shown in FIG. 6(D), the granular raw material 52 having an optimum dopant composition is continuously fed to the melting vessel 62. The solid phase continues to precipitate in the lower part of the mixed melt 91 in the quartz crucible 12, and the single crystal 92 thereby continues to grow.

Figure 6E:
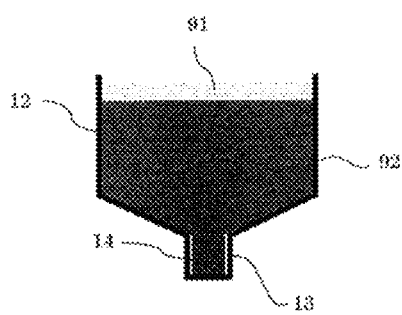

Subsequently, as shown in FIG. 6(E), once the prescribed supply of the granular raw material 52 is completed, the outputs of the infrared ray irradiation equipments 26, 30, 72 and 82 are slowly lowered.

Figure 6F:
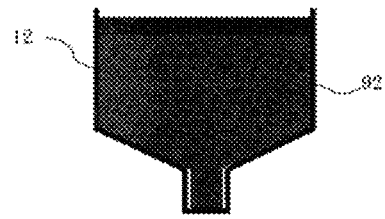

Then, as shown in FIG. 6(F), a complete single crystal 92 is formed as a whole.

After the completion of the single crystal 92, the temperature is slowly lowered, and the closed chamber 11 is cooled to room temperature and then opened, after which the single crystal 92 is taken out of the quartz crucible 12 as a product.

It is noted here that, in this embodiment, the irradiation dose distribution of the infrared ray 28 is designed such that the surface of the single crystal 92 can be maintained as flat as possible throughout the production process. At the same time, by irradiating the vicinity of the periphery 94 of the mixed melt 91 with the infrared ray 32 emitted from the third infrared ray irradiation equipment 30, the temperature of the vicinity of the periphery 94 of the mixed melt 91 is maintained to be higher than the average temperature of the whole mixed melt 91 by at least 3° C., preferably at least 5° C.

As a result, the generation of microcrystals from a release agent-coated part of the inner wall of the quartz crucible 12 or the growth of generated microcrystals can be retarded.

In the single-crystal production equipment 10 and the single-crystal production method according to the present invention, a granular raw material obtained by mixing the granular raw material 52 composed of a granular crystal base material (granular silicon) and a granular dopant at an optimum composition is used. This granular raw material having an optimum composition is stored in the hopper 33 and, using the granular raw material scraping equipment 48 and the quantitative supply equipment 50, the granular raw material 52 is dropped therefrom through the supply pipe 51 into the melting vessel 62, and only the resulting raw material melt 67 is dropped into the quartz crucible 12 below, whereby the processes from the supplying and the melting of the granular raw material 52 to the solidification of a single crystal are continuously performed.

In other words, in a steady state, the granular raw material 52, which is continuously supplied into the melting vessel 62, is heated and melted to obtain the raw material melt 67, and the single crystal 92 is precipitated by supplying the thus obtained raw material melt 67 into the quartz crucible 12; therefore, the resulting single crystal 92 has the same composition as that of the granular raw material 52 having an optimum composition.

Accordingly, the single crystal 92 being produced is allowed to uniformly have an optimum composition.

This enables to produce a high-quality single crystal having a uniform composition at a dopant concentration that allows the single crystal to realize a high conversion efficiency when used for photovoltaic power generation with good yield, which consequently contributes to a reduction of the production cost.

The single-crystal production equipment 10 of the present invention and a single-crystal production method using the single-crystal production equipment 10 have been described thus far; however, the present invention is not restricted to the above-described embodiments.

In the above-described embodiments, for the production of an N-type semiconductor, a mixed granular raw material, which is obtained by mixing a dopant-free high-purity silicon granular raw material and a granular raw material doped with phosphorus at a high concentration such that the resultant has a prescribed optimum composition, is used.

For the production of a P-type semiconductor, a mixed granular raw material, which is obtained by mixing a dopant-free high-purity silicon granular raw material and a granular raw material doped with boron at a high concentration such that the resultant has a prescribed optimum composition, is used.

When a dopant-free high-purity granular silicon and a granular raw material doped with phosphorus, boron or the like at a high concentration are separately supplied, there is an advantage that the dopant concentration in the product can be changed as appropriate. However, in most cases, since the optimum concentration is known, it is efficient to prepare a granular raw material (granular silicon+granular dopant) that has a composition ratio conforming to the optimum concentration and to supply this granular raw material at once.

Further, in the above-described embodiments, no particular mention is made on the particle size of the granular raw material 52; however, when the particle size of the granular raw material 52 is excessively large, it may take time to melt the granular raw material 52. On the other hand, an excessively small particle size is likely to cause inconvenience such as scattering of the granular raw material 52 during the supply.

Therefore, the particles of the granular raw material 52 preferably have a size of approximately 0.1 to 0.5 mm in diameter.

Moreover, in the above-described embodiments, a case where a dopant-free high-purity silicon granular raw material is used as the granular crystal base material was described as an example, the granular crystal base material is not restricted thereto, and any granular raw material 52 prepared in accordance with the substance to be produced can be used.

Furthermore, in the above-described embodiments, with regard to the number of the respective constituents such as the infrared ray irradiation equipments 26, 30, 72 and 82 each irradiating an infrared ray, the melting vessel 62, the quantitative supply equipment 50, the granular raw material scraping equipment 48 and the supply pipe 51, a case where these constituents are each arranged singly was described; however, each constituent may be arranged in a plural number in accordance with the size of a single crystal to be grown, and the number of each constituent can be set as appropriate.

In the above-described embodiments, a mode of triplex structure is adopted for the boat-shaped melting vessel 62; however, other structure may also be adopted and, for example, the melting vessel 62 shown in FIG. 4 can be used as well.

Further, in the above-described embodiments, the granular raw material scraping equipment 48 and the supply pipe 51 are used as granular raw material supply apparatus; however, they may be omitted depending on the case and, in such a case, the granular raw material 52 may be directly supplied to the melting vessel 62 from the quantitative supply equipment 50.

In the above-described manner, a variety of modifications can be made in the single-crystal production equipment 10 and the single-crystal production method according to the present invention within the scope of the objects of the present invention.

REFERENCE SIGNS LIST

10: single-crystal production equipment
11: closed chamber
12: quartz crucible
13: recess
14: seed single crystal
15: granular raw material lump
16: carbon holder
17: auxiliary heating equipment
18: insulating material
19: crucible table
20: crucible rotating mechanism
22: crucible vertical movement mechanism
26: first infrared ray irradiation equipment
27: infrared ray transmitting window
28: infrared ray
30: third infrared ray irradiation equipment
31: infrared ray transmitting window
32: infrared ray
33: hopper
46: attachment-detachment mechanism
47: storage container
48: granular raw material scraping equipment
50: granular raw material quantitative supply equipment
51: supply pipe
52: granular raw material
53: funnel for granular raw material
54: funnel for raw material melt
55: high-frequency induction heating equipment
57: cylindrical section
58: funnel-shaped section
60: position adjusting mechanism
61: boat-shaped vessel
62: granular raw material melting vessel
63: separation plate
64: melting dish
65: separation dish
66: groove
67: raw material melt 68: outlet
70: melting vessel rotating mechanism
72: second infrared ray irradiation equipment
82: second infrared ray irradiation equipment
73: infrared ray transmitting window
74: infrared ray
84: infrared ray transmitting window
85: infrared ray
90: melt phase
91: mixed melt
92: single crystal
93: vicinity of the periphery of melt phase
94: vicinity of the periphery of mixed melt

The invention claimed is:

1. A single-crystal production equipment for producing a large single crystal by placing a seed single crystal in a single-crystal production crucible, supplying a raw material melt, which is obtained by melting a granular raw material using a granular raw material melting apparatus, into said single-crystal production crucible, and allowing the single crystal to precipitate as a solid on said seed single crystal,
wherein said single-crystal production equipment comprises, at least:
a granular raw material supply apparatus which supplies a certain amount of said granular raw material to the granular raw material melting apparatus positioned therebelow;
said granular raw material melting apparatus comprises a granular raw material melting vessel which receives said granular raw material and a vessel heating equipment which heats said granular raw material melting vessel and thereby melts said granular raw material in said granular raw material melting vessel to generate the raw material melt which is supplied to said single-crystal production crucible positioned therebelow;
a crystallization apparatus which includes said single-crystal production crucible in which said seed single crystal is placed on the bottom, and
an infrared ray irradiation equipment which irradiates an infrared ray to the upper surface of said seed single crystal in said single-crystal production crucible,
wherein said single-crystal production equipment is configured such that said raw material melt supplied from said granular raw material melting apparatus is dropped into the melt formed by irradiating the upper surface of said seed single crystal with said infrared ray, and the large single crystal is allowed to precipitate out of the thus formed mixed melt and an additional infrared ray irradiation equipment arranged above said single-crystal production crucible heats an area around a periphery of the melt and/or the mixed melt adjacent a sidewall of the single-crystal production crucible, and
wherein said infrared radiation equipment which irradiates the infrared ray to the upper surface of said seed single crystal comprises an elliptical reflector and an infrared lamp or laser irradiation equipment for laser light irradiation.

2. The single-crystal production equipment according to claim 1, wherein said granular raw material supply apparatus comprises:
a hopper which stores said granular raw material; and
a supply pipe through which the granular raw material is supplied to a prescribed position of the granular raw material melting apparatus below.

3. The single-crystal production equipment according to claim 2, wherein a material of said supply pipe is quartz.

4. The single-crystal production equipment according to claim 2, wherein said hopper is constituted by plural hoppers in which granular raw materials having different compositions are each stored.

5. The single-crystal production equipment according to claim 1, wherein said granular raw material melting apparatus and said crystallization apparatus are arranged inside a closed chamber.

6. The single-crystal production equipment according to claim 5, wherein said granular raw material supply apparatus is arranged inside said closed chamber.

7. The single-crystal production equipment according to claim 1, wherein said granular raw material melting vessel comprises:
a melting section where said granular raw material is heated and melted; and
a melt retaining section where only a melt generated in said melting section is retained.

8. The single-crystal production equipment according to claim 7, wherein said granular raw material melting vessel is constituted by:
a boat-shaped vessel;
a separation plate which divides said boat-shaped vessel into said melting section and said melt retaining section and comprises a groove on a lower part; and
an outlet provided at an upper part of the melt retaining section through which the melt is provided to the crucible below.

9. The single-crystal production equipment according to claim 1, wherein said vessel heating equipment is a high-frequency induction heating equipment.

10. The single-crystal production equipment according to claim 1, wherein a part or the entirety of said granular raw material melting vessel is composed of platinum, iridium, quartz, silicon carbide, carbon, graphite, a carbon or graphite material whose surface has been converted to silicon carbide, or a carbon or graphite material whose surface has been coated with silicon carbide in advance.

11. The single-crystal production equipment according to claim 1, comprising said granular raw material supply apparatus in a plural number.

12. The single-crystal production equipment according to claim 11, comprising said granular raw material melting apparatus in a plural number.

13. The single-crystal production equipment according to claim 1, wherein said single-crystal production crucible is configured such that a recess is formed on a central part of the bottom and said seed single crystal is arranged inside said recess.

14. The single-crystal production equipment according to claim 1, wherein an auxiliary heating equipment is arranged on the outer side of said single-crystal production crucible.

15. The single-crystal production equipment according to claim 1, wherein the bottom of said single-crystal production crucible is inclined downward toward the center.

16. The single-crystal production equipment according to claim 1, wherein the inner wall of said single-crystal production crucible is coated with a release agent.

17. The single-crystal production equipment according to claim 1, wherein said single-crystal production crucible is rotatable in a horizontal direction.

18. The single-crystal production equipment according to claim 1, wherein said single-crystal production crucible is movable in the vertical direction.

* * * * *